US005841705A

United States Patent [19]

Hamamoto et al.

[11] Patent Number: 5,841,705

[45] Date of Patent: Nov. 24, 1998

[54] SEMICONDUCTOR MEMORY DEVICE HAVING CONTROLLABLE SUPPLYING CAPABILITY OF INTERNAL VOLTAGE

[75] Inventors: Takeshi Hamamoto; Kiyohiro Furutani; Yoshikazu Morooka, all of Hyogo, Japan

[73] Assignee: Mitsubishi Denki Kabushiki Kaisha, Tokyo, Japan

[21] Appl. No.: 924,501

[22] Filed: Sep. 5, 1997

Related U.S. Application Data

[62] Division of Ser. No. 645,347, May 13, 1996, Pat. No. 5,699,303.

[30] Foreign Application Priority Data

May 15, 1995 [JP] Japan .............................. 7-116021(P)

[51] Int. Cl.[6] .................................................. G11C 13/00

[52] U.S. Cl. ..................................... 365/189.09; 365/200

[58] Field of Search ......................... 365/189.09, 189.01, 365/200, 201

[56] References Cited

U.S. PATENT DOCUMENTS

| | | |
|---|---|---|
| 5,410,507 | 4/1995 | Tazunoki et al. . |
| 5,436,586 | 7/1995 | Miyamoto . |
| 5,568,440 | 10/1996 | Tsukude et al. . |
| 5,587,956 | 12/1996 | Tanida . |
| 5,604,707 | 2/1997 | Kuge et al. . |
| 5,659,509 | 8/1997 | Golla et al. ............................ 365/200 |

OTHER PUBLICATIONS

Y. Konishi et al., "A 38–ns 4–Mb DRAM with a Battery–Backup (BBU) Mode", IEEE Journal of Solid State Circuits, 1990, vol. 25, No. 5, pp. 1112–1117.

Patent Abstracts of Japan, P–382, 1985, vol. 9, No. 207, JP 60–69896.

Kenmizaki et al., "A 36uA 4Mb PSRAM with Quadruple Array Operation," *VLSI Circuits Symposium Digest,* 1989, pp. 79–80.

*Primary Examiner*—Terrell W. Fears

*Attorney, Agent, or Firm*—McDermott, Will & Emery

[57] ABSTRACT

When an external $\overline{RAS}$ and external $\overline{CAS}$ are input to a RAS buffer and a CAS buffer, an internal $\overline{RAS}$ and an internal $\overline{CAS}$ are generated. The internal $\overline{RAS}$ is input to a clock generating circuit and a CBR mode determination circuit and the internal $\overline{CAS}$ is input to the CBR mode determination circuit. The clock generating circuit outputs a pump clock to first and second WL pumps upon input of internal $\overline{RAS}$, and the first WL pump supplies charge to a Vpp power supply. If $\overline{CAS}$ is input prior to $\overline{RAS}$ during refresh operation, CBR mode determination circuit inputs a CBR mode signal to the second WL pump which supplies charge to Vpp power supply together with the first WL pump when the pump clock and the CBR mode signal is input thereto.

6 Claims, 21 Drawing Sheets

SEMICONDUCTOR MEMORY DEVICE HAVING CONTROLLABLE SUPPLYING CAPABILITY OF INTERNAL VOLTAGE

This application is a division of application Ser. No. 08/645,347 filed May 13, 1996, now U.S. Pat No. 5,699,303.

BACKGROUND OF THE INVENTION

1. Field of the Invention

The present invention relates to a semiconductor memory device, and particularly to a dynamic random access memory (DRAM) for generating internal voltage.

2. Description of the Background Art

In general, semiconductor devices are roughly classified into volatile memories represented by RAM and non-volatile memories represented by ROM. Volatile memories are further classified roughly into DRAMs and static random access memories (SRAMs). A DRAM activates operation within a chip by inputting a row address strobe signal (hereinafter referred to as $\overline{RAS}$) and a column address strobe signal (hereinafter referred to as $\overline{CAS}$). In $\overline{RAS}$ and $\overline{CAS}$, H (logical high) is a stand-by state and L (logical low) is an active state. By activation of $\overline{RAS}$, an input address is incorporated as a row address. By activation of $\overline{CAS}$, the input address is incorporated as a column address.

FIGS. 15A and 15B are timing charts illustrating how $\overline{RAS}$ and $\overline{CAS}$ are input when in a normal operation mode. FIG. 15A is for normal input of $\overline{RAS}$ and $\overline{CAS}$ when row address and column address are incorporated, while FIG. 15B is for input of $\overline{RAS}$ and $\overline{CAS}$ when only row address is incorporated.

Referring to FIG. 15A, when row and column addresses are incorporated, $\overline{RAS}$ is activated first so as to incorporate the row address, and then $\overline{CAS}$ is activated so as to incorporate the column address.

Referring to FIG. 15B, when only row address is incorporated, activation is effected only on $\overline{RAS}$ while $\overline{CAS}$ is maintained at a standby state so that only row address is incorporated.

In both cases of FIGS. 15A and 15B, N word lines in the memory array are activated within the chip, corresponding to the row address incorporated. N is a constant determined by the configuration of the chip. Usually, N=1, 2, 4, 8, 16, and so on.

DRAMs further employ an inputting method called CBR mode (CAS-Before-RAS-mode) which is used when performing a refresh operation.

FIG. 16 is a timing chart for illustrating the state of input during CBR mode. Referring to FIG. 16, $\overline{CAS}$ is activated before activation of $\overline{RAS}$, in an order opposite to that of FIG. 15A. When in CBR mode, neither of row address and column address is externally incorporated to the chip and M×N word lines on the memory array is activated corresponding to internal row address generated at an address counter within the chip in synchronization with $\overline{RAS}$. Here, this N is the same number as the N mentioned above. Usually, M=1, 2, 4, 8, 16 and so on, also determined by the configuration of the chip.

FIG. 17 shows an example of a memory array 1600 included in a conventional DRAM in general.

Referring to FIG. 17, memory array 1600 is divided into rectangular memory blocks #0–15 each provided with one side having a length of 1 word line, (that is, 1WL length) and another side having a length of 1 bit line (that is, 1BL length). Memory blocks #0–15 each include word lines WL0–15, respectively (although WL1, 3, 5, 7, 9, 11, 13, and 15 are not shown).

In normal operation mode shown in FIGS. 15A and 15B, activation is effected on, for example, four word lines WL0, 4, 10, 14. Meanwhile, in CBR mode, activation is effected on a total of eight word lines, that is, word lines WL0, 4, 10, 14 plus word lines WL2, 6, 8, 12. Accordingly, the example shown in FIG. 17 illustrates the case in which N=4 and N=2.

The word lines described above are at GND when at the standby state, and is charged to a potential Vpp which is higher than power supply potential Vcc when at an activated state. When at the normal operation mode shown in FIGS. 15A and 15B, the charge Q (Normal) consumed per cycle (i.e., cycle in which $\overline{RAS}$ is activated one time) is expressed as Q (Normal)=N×Cw×Vpp, where Cw is the capacitance of one word line.

In addition, as shown in FIG. 17, N=4 memory blocks #0, 4, 10, 14 are operating at the normal operation mode shown in FIGS. 15A and 15B. In particular, the bit lines of the above-described memory blocks are being charged or discharged and sense amplifiers corresponding to these memory blocks are in operation. Meanwhile, at the CBR mode shown in FIG. 16, a total of N×M=8 memory blocks, that is, memory blocks #0, 4, 10, 14 plus memory blocks #2, 6, 8, 12 are in operation. The above-described memory blocks have their bit lines charged or discharged while the sense amplifiers corresponding to these memory blocks are in operation.

However, in the CBR mode shown in FIG. 16, charge Q (CBR) which is consumed within one cycle is expressed as Q (CBR)=N×M×Cw×Vpp and is charged by Vpp power supply as in the normal operation mode. Accordingly, the amount of charge consumed in CBR mode is M times as large as the amount of charge consumed in normal mode.

Furthermore, referring to FIG. 8 in which a partial configuration of a memory cell included in a DRAM 100 is shown, a transfer gate control line TG1 is also sometimes charged to a potential Vpp' which is higher than power supply potential Vcc at Vpp power supply or at a node different from Vpp. Here, charge Q (Normal) consumed within one cycle in normal operation mode is expressed as Q (Normal)=N×Ctg×Vpp (or Q (Normal)=N×Ctg×Vpp') where Ctg is the capacitance of one transfer gate control line, while in CBR mode, Q (CBR)=N×M×Ctg×Vpp (or Q (CBR)=N×M×Ctg×Vpp') so that the amount of charge consumed from Vpp power supply (or Vpp' power supply) is M times as large as the amount of charge consumed in the normal operation mode.

This internal power supply potential Vpp (or Vpp') is generated at Vpp (or Vpp') generating circuit.

FIG. 18 is a circuit diagram showing a general boost pump 1800 employed as a Vpp generating circuit.

Referring to FIG. 18, when capacitance Cp of pump capacitor 1803 included in a boost pump 1800 is used, the charge which can be generated within one cycle by Vpp generating circuit will be expressed as Q=(2Vcc−Vpp)×Cp. Accordingly, when Vpp generating circuit is designed to accommodate the normal operation mode, the charge required for charging the word line would not be sufficient when CBR mode is entered.

In addition, this memory array is formed on a P type semiconductor substrate having a potential Vbb which is lower than GND. As already mentioned, the number of the memory blocks operating at CBR mode is M times as large as the number of memory blocks operating at normal operation mode. Accordingly, when the bit line is charged or discharged, the amount of the substrate current to the P type semiconductor substrate at the sense amplifier portion during CBR mode is M times as large as that of the substrate current obtained in the normal operation mode. The internal power supply potential Vbb is generated at Vbb generating circuit, and charge which can be generated by Vbb generating circuit within one cycle is predetermined as in the above-described Vpp generating circuit. When Vbb generating circuit is designed to accommodate the normal operation mode, the substrate current is increased when CBR mode is entered such that the Vbb potential may be made shallower (i.e., higher) than the prescribed potential.

SUMMARY OF THE INVENTION

An object of the present invention is to provide a semiconductor memory device in which variation in the potential of internal voltage can be prevented even when the number of memory blocks in operation is increased.

According to the present invention, the semiconductor memory device is provided with a plurality of memory blocks each including a plurality of memory cells arranged in a matrix of rows and columns, a mode signal generating means for generating a mode signal to selectively indicate a first mode and a second mode different from the first mode in response to an external control signal input externally, a divided operating means responsive to the mode signal to operate memory blocks of a first number among the plurality of memory blocks when the mode signal indicates the first mode and to operate memory blocks of a second number larger than the first number when the mode signal indicates the second mode, and an internal voltage generating means for generating internal voltage based on external power supply voltage applied externally to supply the internal voltage to memory blocks being operated by the divided operating means among the plurality of memory blocks. An internal voltage supplying means is responsive to the mode signal to have a first supplying capability when in the first mode and a second supplying capability larger than the first supplying capability when in the second mode.

In the above-described semiconductor memory device, when the mode signal indicates the first mode, the first number of memory blocks among the plurality of memory blocks are operated, and the internal voltage is supplied to the memory blocks in operation due to the first supplying capability. When the mode signal indicates the second mode, memory blocks of the second number larger than the above-described first number is operated and internal voltage is supplied to the memory blocks in operation due to the second supplying capability larger than the above-described first supplying capability. Thus, when the mode signal indicates the second mode, amount of internal voltage supplied corresponds to increased number of the memory blocks in operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (1) First Embodiment

Figure 1:
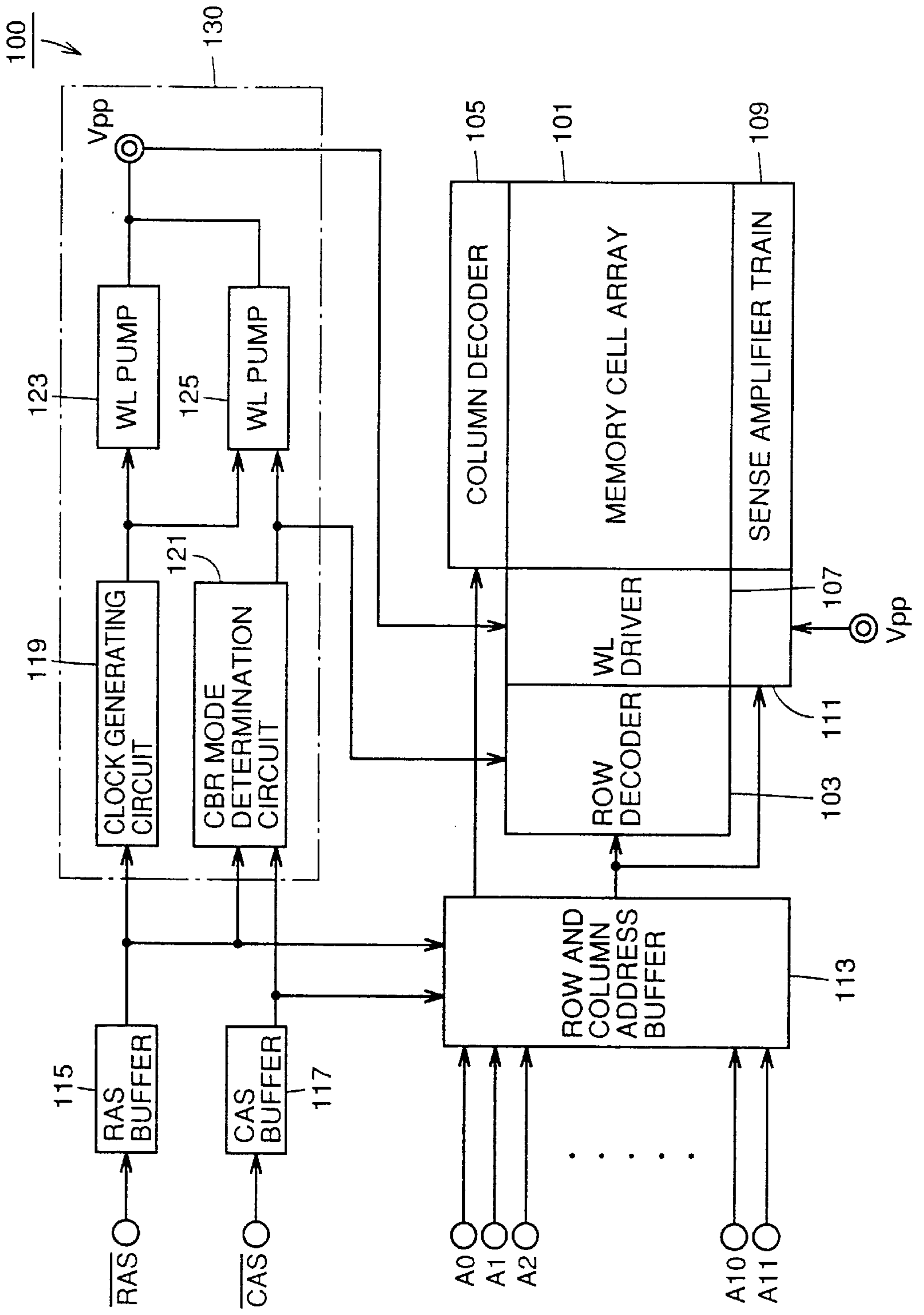
FIG. 1 is a block diagram showing the entire structure of a DRAM according to a first embodiment of the present invention.

Referring to FIG. 1, this DRAM 100 includes a memory cell array 101, a row decoder 103, a column decoder 105, a word line (WL) driver 107, a sense amplifier train 109, a sense amplifier train controller 111, a row and column address buffer 113, an RAS buffer 115, a CAS buffer 117, and an internal voltage generating circuit 130.

Figure 17:
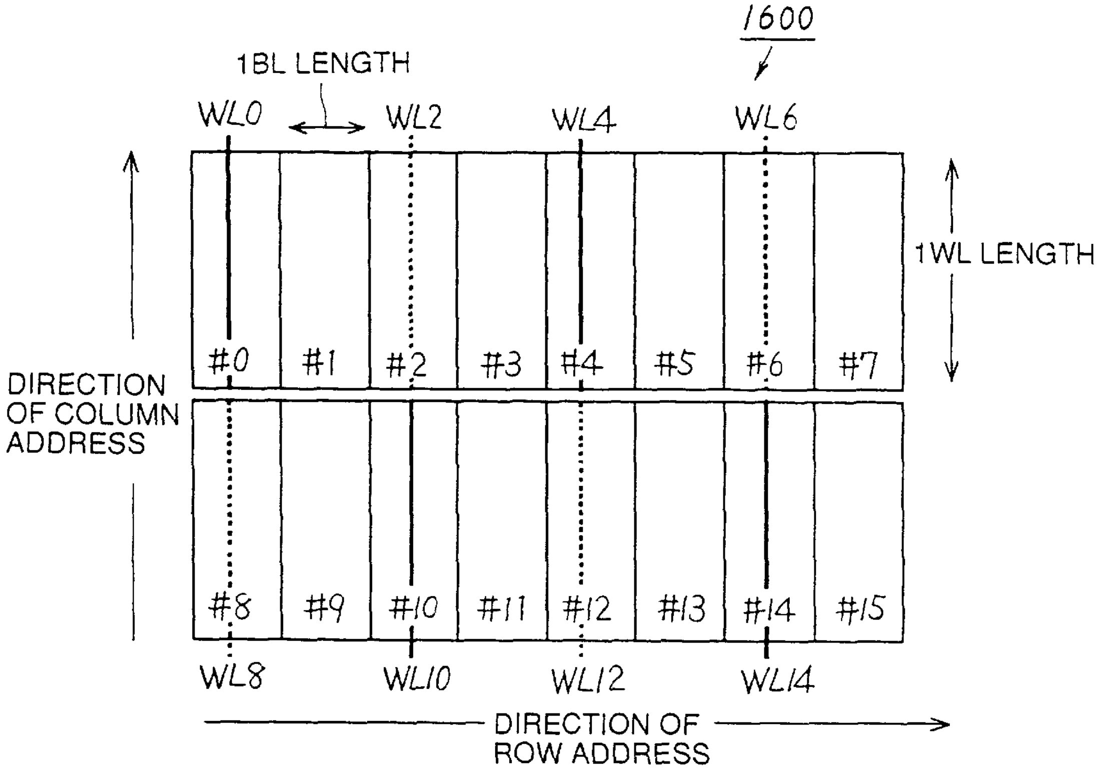
FIG. 17 shows an example of a memory array included in a conventional DRAM in general.

In memory cell array 101, a plurality of word lines (not shown) are arranged along the direction of the rows and a plurality of bit lines (not shown) are arranged along the direction of the columns. Memory blocks (see FIG. 17) divided by one word line length of the word lines and one bit line length of the bit lines are arranged in a matrix along the directions of rows and columns. In addition, a plurality of memory cells (not shown) are arranged at the intersections of the word lines and the bit line pairs.

Row and column address buffer 113 selectively supplies external address signals A0–A11 to row decoder 103 and column decoder 105. Row decoder 103 selects one of the plurality of word lines in response to the row address signal supplied from row and column address buffer 113. Column decoder 105 selects one of the plurality of the bit line pairs in response to the column address signal supplied from row and column address buffer 113. WL driver 107 supplies internal power supply voltage Vpp to the word line selected by row decoder 103 so as to drive this word line. Sense amplifier train 109 includes a plurality of sense amplifiers. The plurality of sense amplifiers are provided corresponding to the plurality of bit line pairs. Each sense amplifier amplifies the potential difference between the corresponding bit line pair.

Figure 2:
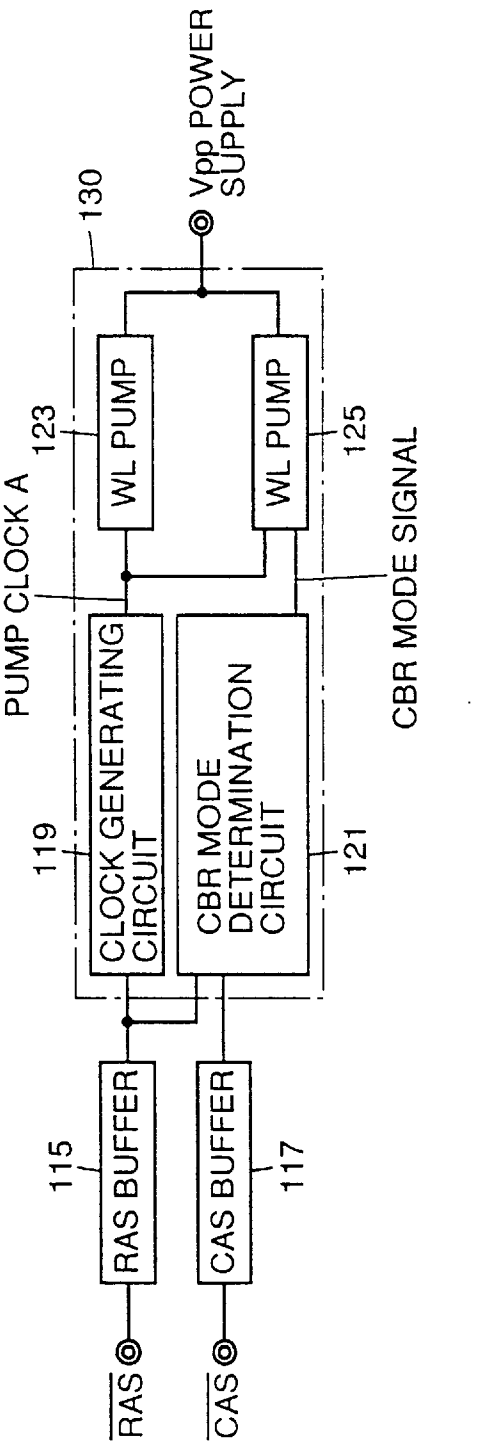
FIG. 2 is a block diagram showing the structure of an RAS buffer, a CAS buffer, and an internal voltage generating circuit.

FIG. 2 is a block diagram showing the structure of RAS buffer 115, CAS buffer 117 and internal voltage generating circuit 130 in FIG. 1.

Referring to FIG. 2, internal voltage generating circuit 130 includes a clock generating circuit 119, a CBR mode determination circuit 121, and word line (WL) pumps 123, 125.

CBR mode determination circuit 121 is connected to RAS buffer 115 and CAS buffer 117. Clock generating circuit 119 is connected to RAS buffer 115. WL pump 123 is connected to clock generating circuit 119 while WL pump 125 is connected to clock generating circuit 119 as well as to CBR mode determination circuit 121.

In FIG. 2, an internal row address strobe signal (hereinafter referred to as internal $\overline{RAS}$) is generated from RAS buffer 115 based on externally input $\overline{RAS}$, and is input to clock generating circuit 119 and CBR mode determination circuit 121. Also, an internal column address strobe signal (hereinafter referred to as internal $\overline{CAS}$) is generated from CAS buffer 117 based on externally input $\overline{CAS}$, and is input to CBR mode determination circuit 121.

Figure 15A:
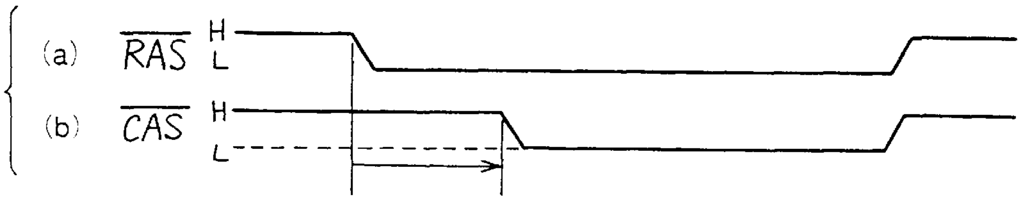
FIGS. 15A and 15B are timing charts illustrating how $\overline{RAS}$ and $\overline{CAS}$ are input when at normal operation mode.
Figure 15B:
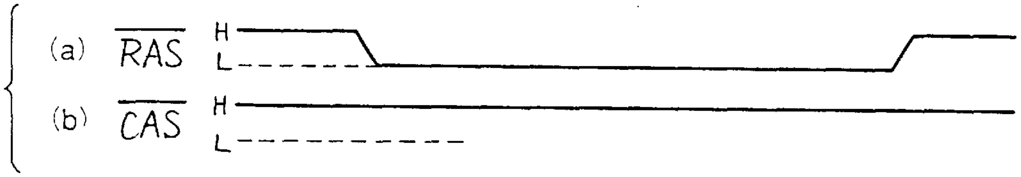
Figure 16:
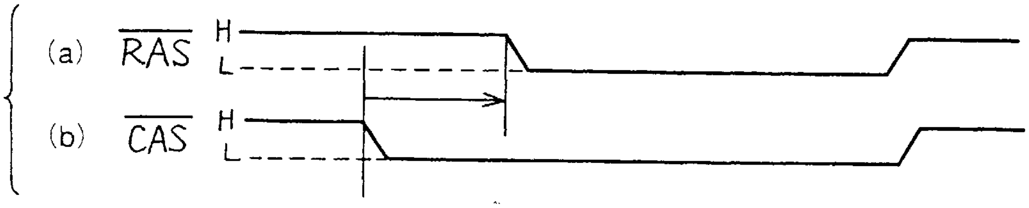
FIG. 16 is a timing chart showing how RAS and CAS are input when at CBR mode.

A pump clock A is generated from clock generating circuit 119 based on the input internal $\overline{RAS}$, and is input to WL pumps 123, 125. When CBR mode determination circuit 121 determines the timing of CBR mode from the input timing of the input internal $\overline{RAS}$ and internal $\overline{CAS}$, it generates a CBR mode signal which is to be input to WL pump 125. (Description of CBR mode has been given with reference to FIG. 15.)

Figure 18:
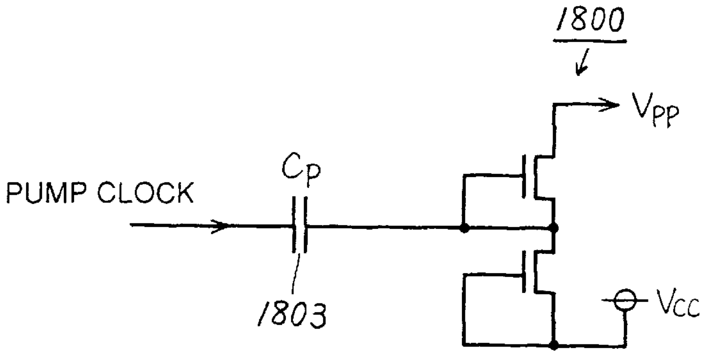
FIG. 18 is a circuit diagram of a general boost pump employed as Vpp generating circuit.

WL pump 123 is, for example, boost pump 1800 shown in FIG. 18 or a similar internal power supply voltage (Vpp) generating circuit.

WL pump 123 stores the charge based on power supply voltage Vcc in synchronization with pump clock A generated at clock generating circuit 119 to supply the charge to Vpp power supply. Thus, internal power supply voltage Vpp is boosted.

Other circuits can also be employed as WL pump 123 as long as they have a function similar to that of the circuit shown in FIG. 18.

Figure 3:
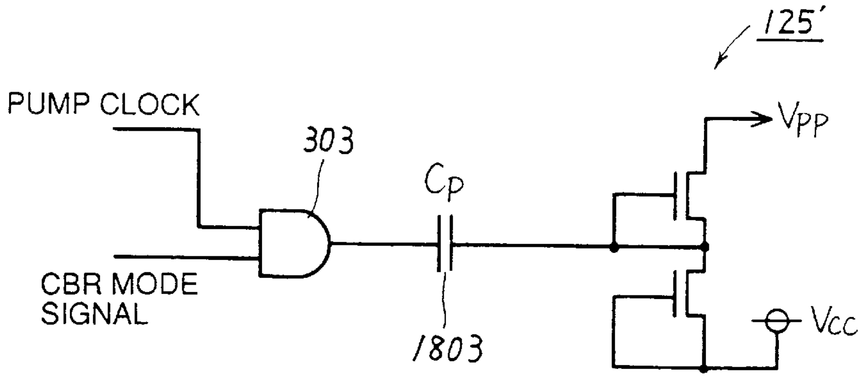
FIG. 3 is a circuit diagram showing a Vpp generating circuit (a boost pump) as an example of a WL pump in FIG. 2.

FIG. 3 shows a Vpp generating circuit (i.e., a boost pump) 125' as an example of WL pump 125 in FIG. 2.

Referring to FIG. 3, Vpp generating circuit 125' is a circuit similar to the circuit shown in FIG. 18, further including an AND gate 303. AND gate 303 has its input connected to clock generating circuit 119 and CBR mode determination circuit 121 in FIG. 2. Output of NAND gate 303 is connected to capacitor 1803 included in Vpp generating circuit 125'.

In FIG. 3, pump clock A generated at clock generating circuit 119 and CBR mode signal generated at CBR mode determination circuit 121 are input to AND gate 303. At this time, charge is supplied to Vpp power supply in synchronization with an AND signal of pump clock A and CBR mode signal. Accordingly, WL pump 125 is operated in addition to WL pump 123 such that sufficient charge can be supplied to Vpp power supply only when CBR mode signal is active (i.e., during CBR mode).

Thus, gradual degradation of the internal power supply voltage Vpp can be prevented even when the number of memory blocks operated is larger than in normal operation.

Figure 4:
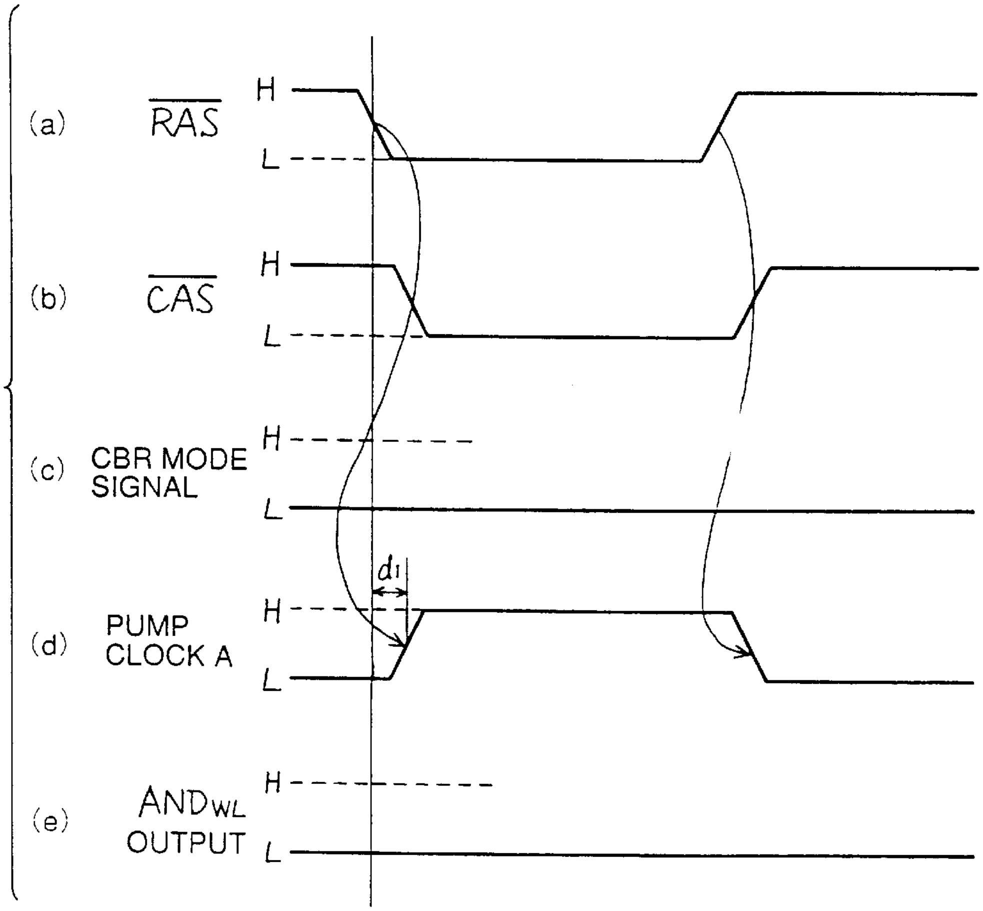
FIG. 4 is a timing chart illustrating an operation of the Vpp generating circuit in FIG. 3.
Figure 5:
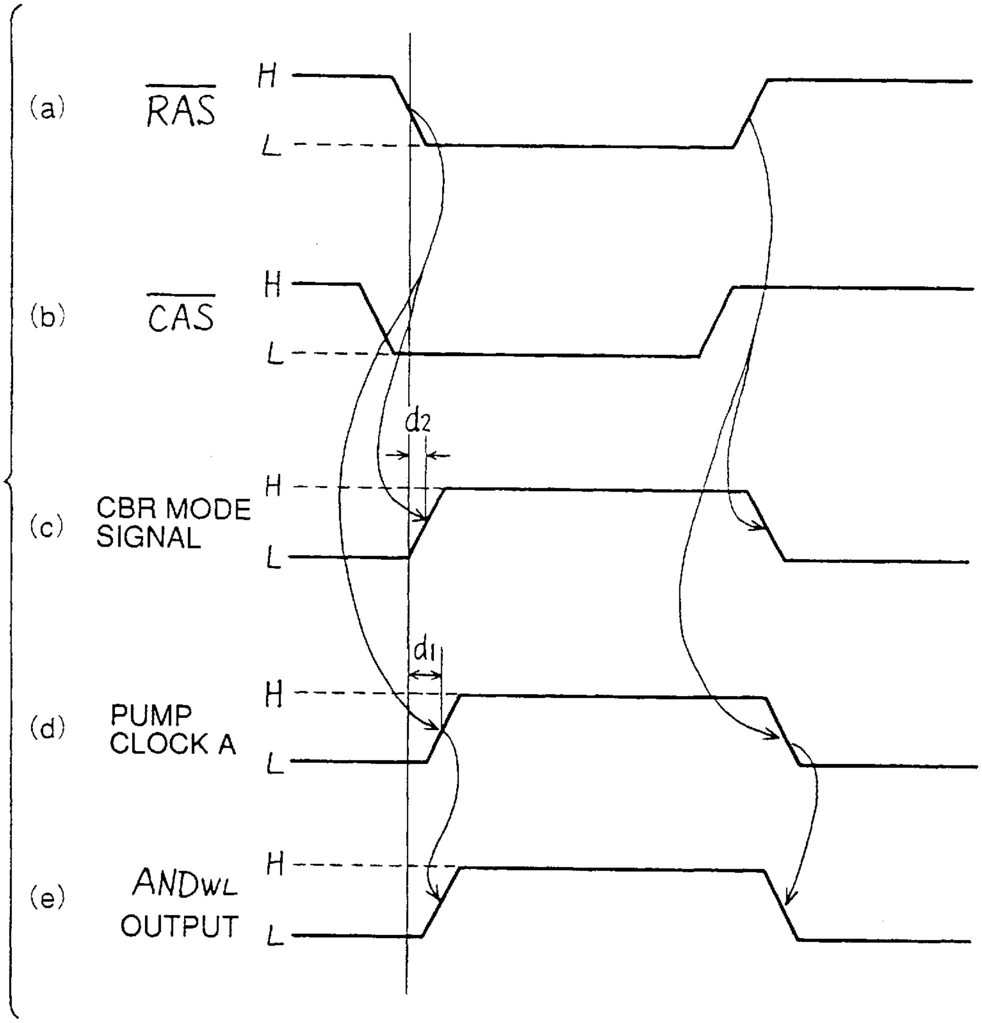
FIG. 5 is a timing chart illustrating another operation of the Vpp generating circuit in FIG. 3.

FIGS. 4 and 5 are timing charts for illustrating the operation of Vpp generating circuit 125' in FIG. 3. FIG. 4 is for normal operation mode and FIG. 5 is for CBR mode.

The operation of Vpp generating circuit 125' in FIG. 3 will now be described in detail with reference to the timing chart of FIG. 4.

First, description is made on the case in which only WL pump 123 is in operation (i.e., when at the normal operation mode).

As shown in FIG. 4, if the fall of $\overline{RAS}$ precedes the fall of $\overline{CAS}$, pump clock A is generated at clock generating circuit 119 in response to the fall of $\overline{RAS}$ when a time period of $\Delta t=d_1$ has passed after the fall of $\overline{RAS}$, and is input to WL pump 123. Accordingly, WL pump 123 is operated to supply charge to Vpp power supply.

The case in which WL pump 125 (or Vpp generating circuit 125') is in operation (i.e., CBR mode) will be described next.

As shown in FIG. 5, if the fall of $\overline{CAS}$ precedes the fall of $\overline{RAS}$, CBR mode determination circuit 121 determines that CBR mode is entered. CBR mode signal is generated in response to the fall of $\overline{RAS}$ after a time period of $\Delta t=d_2$ (where $d_1>d_2$) so as to be input to AND gate 303 in WL pump 125. In addition, pump clock A is generated after a time period of $\Delta t=d_1$ and is input to WL pump 123 and AND gate 303 in WL pump 125. Accordingly, WL pump 123 supplies charge to Vpp power supply by the input pump clock A. WL pump 125 has its AND output of AND gate 303 made to rise by the input pump clock A and CBR mode signal so as to supply charge to Vpp power supply. In addition, CBR mode signal and pump clock A fall when $\overline{RAS}$ rises, and thus AND output of AND gate 303 falls such that no charge is supplied to Vpp power supply anymore by WL pump 125.

(2) Second Embodiment

Figure 6:
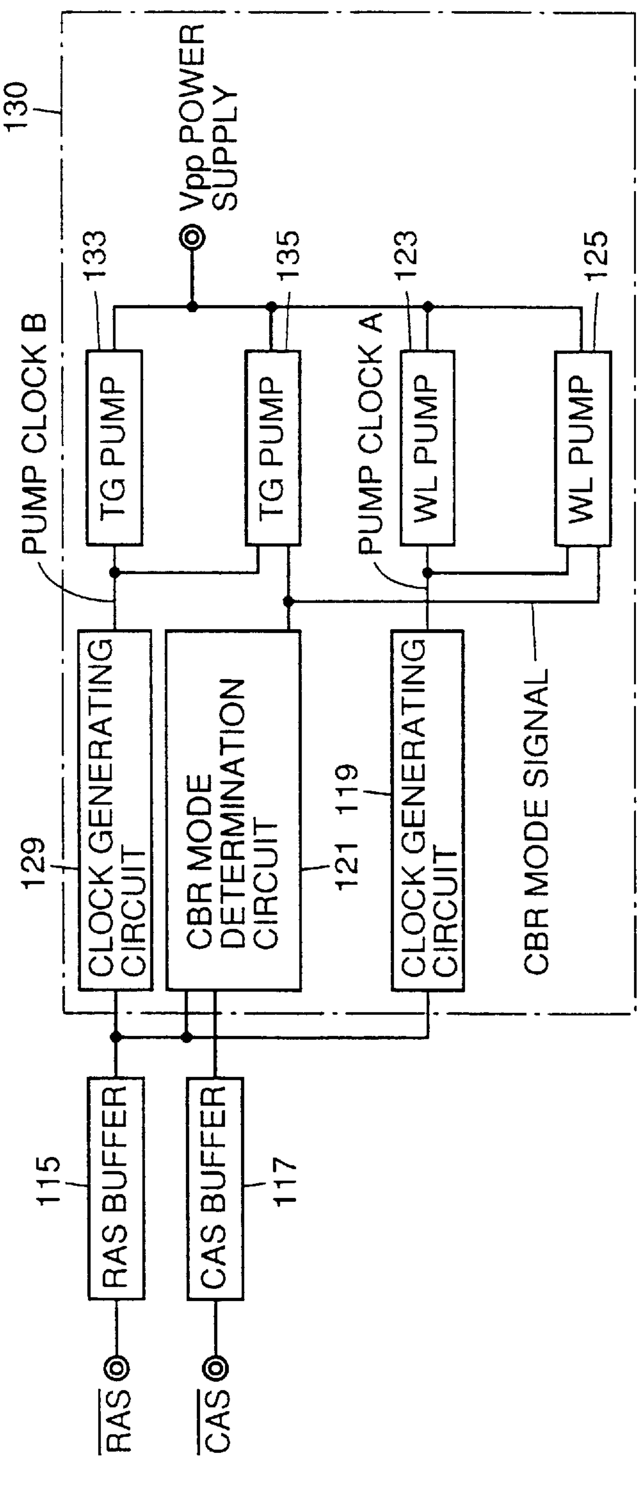
FIG. 6 is a block diagram showing a structure of RAS buffer, CAS buffer and internal voltage generating circuit according to second embodiment of the present invention.

FIG. 6 is a block diagram showing a structure of an RAS buffer 115, a CAS buffer 117 and an internal voltage generating circuit 130 according to the second embodiment of the present invention.

Referring to FIG. 6, internal voltage generating circuit 130 includes clock generating circuits 119, 129, a CBR mode determination circuit 121, WL pumps 123, 125, and transfer gate control line (TG) pumps 133, 135.

Clock generating circuit 119, CBR mode determination circuit 121 and WL pumps 123, 125 are connected in a manner similar to what is shown in FIG. 2. Clock generating circuit 129 is in connection with RAS buffer 115. TG pump 133 is connected to clock generating circuit 129 while TG pump 135 is connected to clock generating circuit 129 and CBR mode determination circuit 121.

In other words, internal voltage generating circuit 130 according to the second embodiment has a structure in which internal voltage generating circuit 130 of the first embodiment shown in FIG. 2 is additionally provided with clock generating circuit 129 and TG pumps 133, 135 used for boosting internal voltage of transfer gate control line.

Clock generating circuit 129 generates a pump clock B which is input to TG pumps 133, 135. CBR mode determination circuit 121 determines the timing of the inputs of internal $\overline{RAS}$ and internal $\overline{CAS}$ generated at RAS buffer 115 and CAS buffer 117, respectively, based on externally input $\overline{RAS}$ and $\overline{CAS}$, and when at CBR mode, outputs CBR mode signal to WL pump 125 and TG pump 135.

TG pump 133 is a circuit similar to Vpp generating circuit shown in FIG. 18.

Figure 7:
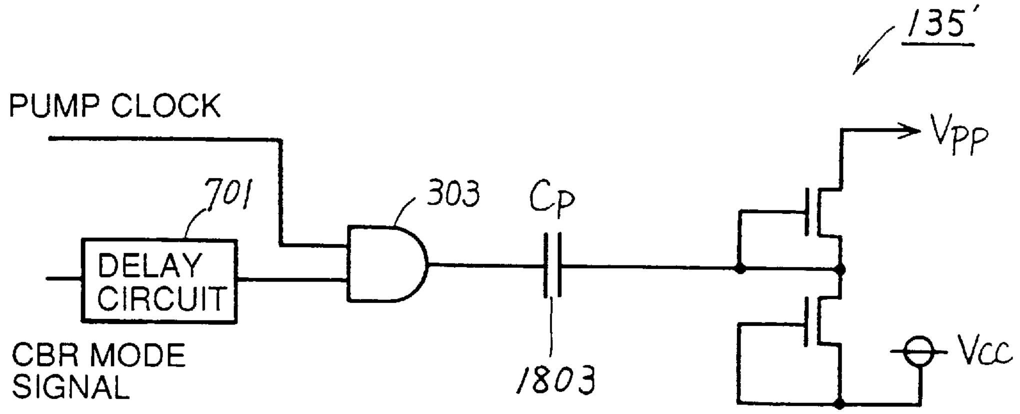
FIG. 7 is a circuit diagram showing a Vpp generating circuit as an example of a TG pump in FIG. 6.

FIG. 7 shows a Vpp generating circuit 135' as an example of TG pump 135 in FIG. 6.

In Vpp generating circuit 135' of FIG. 7, a delay circuit 701 is connected to the input terminal of AND gate 303 to which CBR mode signal from Vpp generating circuit of FIG. 3 is input.

In FIG. 7, input timing of CBR mode signal can be delayed by delay circuit 701.

Figure 8:
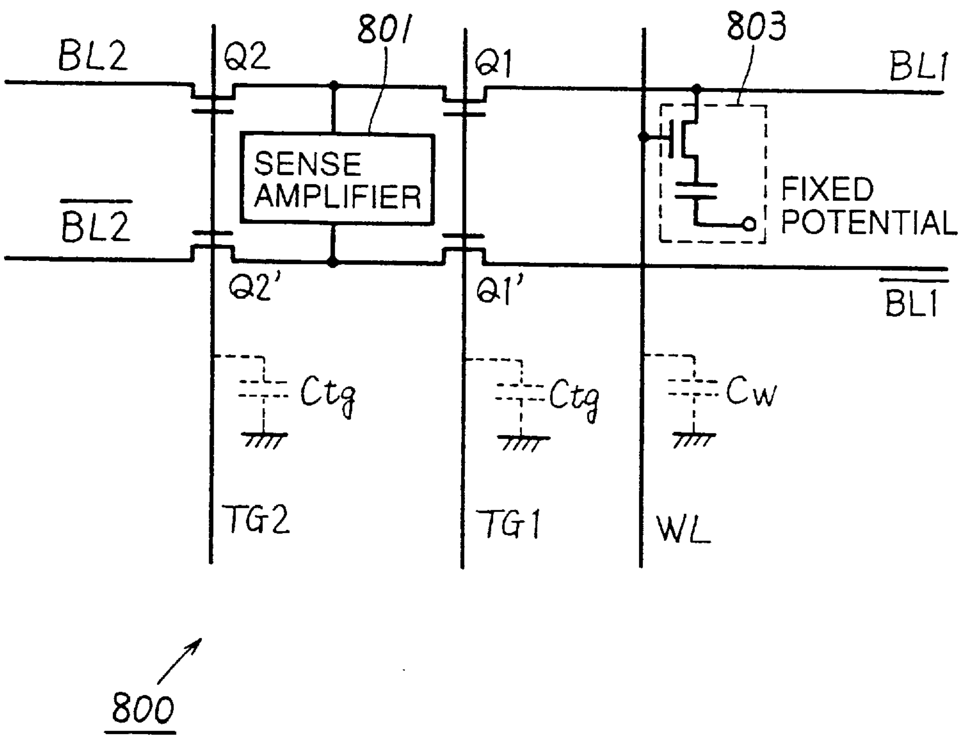
FIG. 8 is a circuit diagram showing a partial structure of a memory cell array included in DRAM according to embodiments of the present invention.

FIG. 8 shows a partial structure of a memory cell array included in a DRAM 100 according to the embodiments of the present invention.

Referring to FIG. 8, memory cell array 800 includes a sense amplifier 801, bit lines BL1, BL2, complementary bit lines $\overline{BL1}$, $\overline{BL2}$, transfer gate control lines TG1, TG2, a word line WL, a memory cell 803, transistors Q1, Q1', Q2, Q2', and capacitors Ctg, Cw.

The transistor included in memory cell array 803 has its drain electrode connected to bit line BL1 and its gate electrode connected to word line WL. Sense amplifier 801 is in connection with bit line BL1 and complementary bit line $\overline{BL1}$ via transistors Q1 and Q1', respectively. It is in connection with bit line BL2 and complementary bit line $\overline{BL2}$ via transistors Q2 and Q2', respectively. Transistors Q1, Q1' have their gate electrodes connected to transfer gate control line TG1, and transistors Q2, Q2' have their gate electrodes connected to transfer gate control line TG2. Two capacitors Ctg have their one electrodes connected to transfer gate control lines TG1 and TG2, respectively while having the other electrodes connected to ground. Capacitor Cw has its one electrode connected to word line WL and the other electrode connected to ground.

Internal voltage Vpp generated by internal voltage generating circuit 130 in FIG. 6 is provided to WL driver 107 and sense amplifier train controller 111 shown in FIG. 1. WL driver 107 is driven by providing internal voltage Vpp to a word line selected by row decoder 103. Sense amplifier train controller 111 selectively provides internal voltage Vpp to transistor control lines TG1 and TG2 of FIG. 8 in response to row address signal from row and column address buffer 113.

Figure 9:
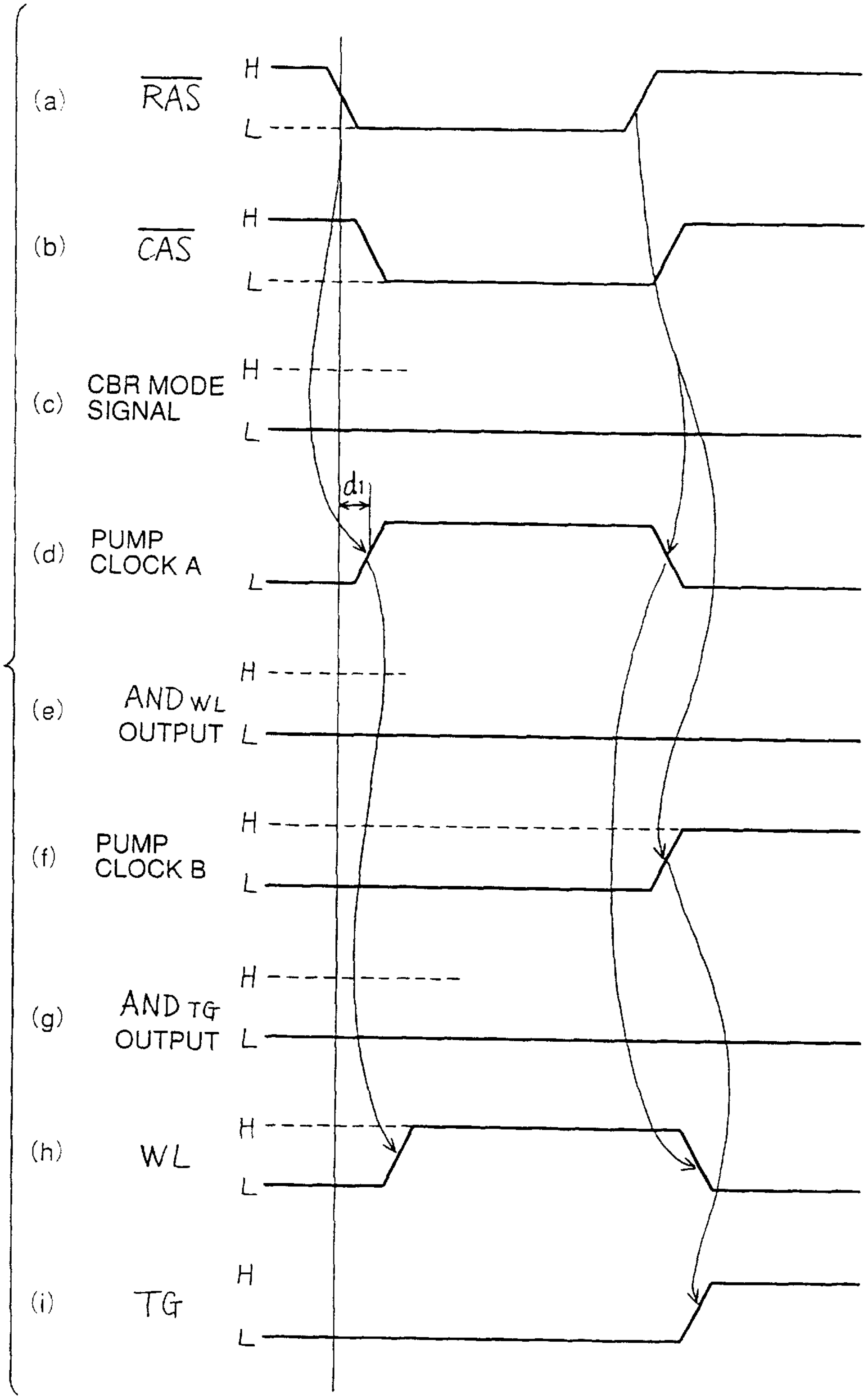
FIG. 9 is a timing chart illustrating the operation of Vpp generating circuit provided as an example of WL pump and Vpp generating circuit provided as an example of TG pump according to the second embodiment.
Figure 10:
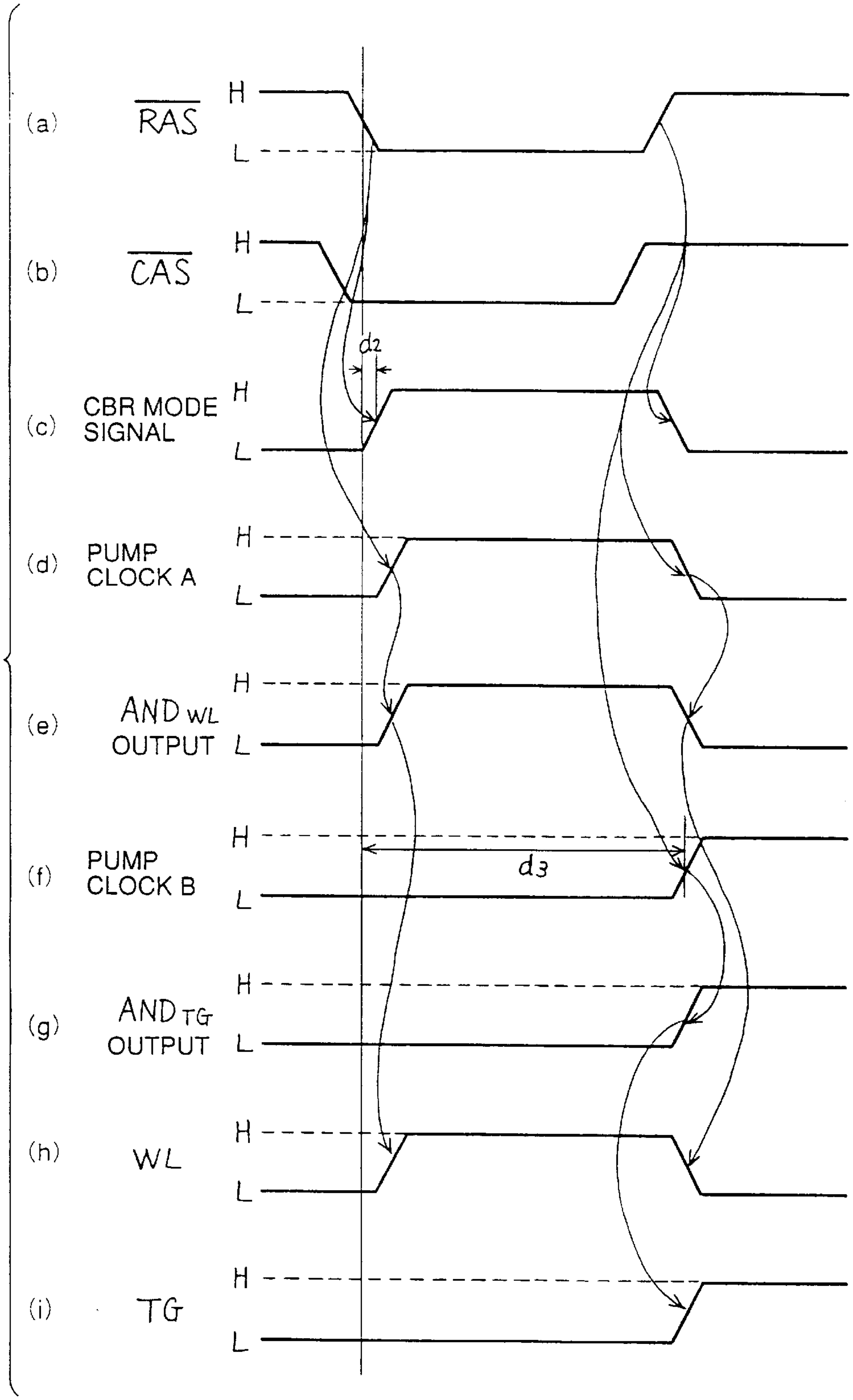
FIG. 10 is a timing chart illustrating the operation of Vpp generating circuit provided as an example of WL pump and Vpp generating circuit provided as an example of TG pump according to the second embodiment.

FIGS. 9 and 10 are timing charts for illustrating the operations of Vpp generating circuits which are an example of WL pump 125 and an example of TG pump 135, respectively. FIG. 9 shows the operation during the normal operation mode and FIG. 10 shows the operation during the CBR mode.

Operation of WL pump 125 and TG pump 135 according to the second embodiment will now be described with reference to the timing charts of FIGS. 9 and 10.

First, description is made on the operation during the normal operation mode.

As shown in FIG. 9, if $\overline{CAS}$ is to fall after the fall of $\overline{RAS}$, pump clock A is generated at clock generating circuit 119 in response to the fall of $\overline{RAS}$ with the delay of $\Delta t=d_1$ from this fall of $\overline{RAS}$ so as to be input to WL pump 123. Thereafter, a pump clock B instead of pump clock A is generated in response to the rise of $\overline{RAS}$ and is input to TG pump 133. Accordingly, WL pump 123 and TG pump 133 are operated successively, and internal voltage Vpp is supplied to word line WL after a time period of $\Delta t=d_1$ as well as to transfer gate control line TG1 after a time period of $\Delta t=d_3$.

Operation during CBR mode will now be described.

As shown in FIG. 10, if $\overline{CAS}$ is to fall before the fall of $\overline{RAS}$, CBR mode signal is generated at CBR mode determination circuit 121 in response to the fall of $\overline{RAS}$ after a time period of $\Delta t=d_2$ from this fall of $\overline{RAS}$ so as to be input to WL pump 125 and TG pump 135. Then, pump clock A is generated at clock generating circuit 119 after a time period of $\Delta t=d_1$ (where $d_2 < d_1$) and is input to WL pumps 123 and 125. AND output of AND gate 403 in WL pump 125 attains H (logical high) and WL pump 125 is operated in addition to WL pump 123 so that sufficient internal voltage Vpp is supplied to word line WL during refresh operation. Meanwhile, in response to the rise of $\overline{RAS}$, pump clock B is generated at clock generating circuit 129 and is input to TG pumps 133 and 135. By CBR mode signal input to TG pump 135 with a delay of a time period of $\Delta t=d_3$ (where $d_1<d_3$), due to delay circuit 701, AND output of AND gate 403 attains H and TG pump 135 is put into operation in addition to TG pump 133 such that sufficient internal voltage Vpp is supplied to transfer gate control line TG1 during refresh operation.

Turning now to FIG. 8, advantage obtained by making difference between the input timings of pump clock A from clock generating circuit 119 to WL pump 125 and pump clock B from clock generating circuit 129 to TG pump 135 will be described.

In FIG. 8, transfer gate control lines TG1, TG2 are precharged to potential Vpp and word line WL is at GND in the beginning. In response to the fall of external $\overline{RAS}$, transfer gate control line TG2 is first charged to GND and transistors Q2 and Q2' are turned OFF. Thereafter, word line WL is activated and is charged to potential Vpp. Stored data in the memory cell is read out to complementary bit line $\overline{BL1}$, and a readout potential is conducted to sense amplifier 801 via transistors Q1 and Q1'. Sense amplifier 801 is activated so that the readout potential is amplified, and the stored data is restored in the memory cell. Then, in response to the rise of $\overline{RAS}$, word line WL is charged to GND and transfer gate control line TG2 is precharged to potential Vpp. In other words, charge is dissipated from Vpp power supply by the above-described operations immediately after the fall of $\overline{RAS}$ and immediately after the rise of $\overline{RAS}$. Accordingly, if the timings of pump clock A for charging WL and pump clock B for charging TG are changed such that WL pump 125 is operated immediately after the fall of $\overline{RAS}$ and TG pump 135 is operated immediately after the rise of $\overline{RAS}$, variation in Vpp power supply can be reduced.

Thus, gradual degradation in the voltage of transfer gate control line TG1 as well as in word line WL can be prevented.

(3) Third Embodiment

Figure 11:
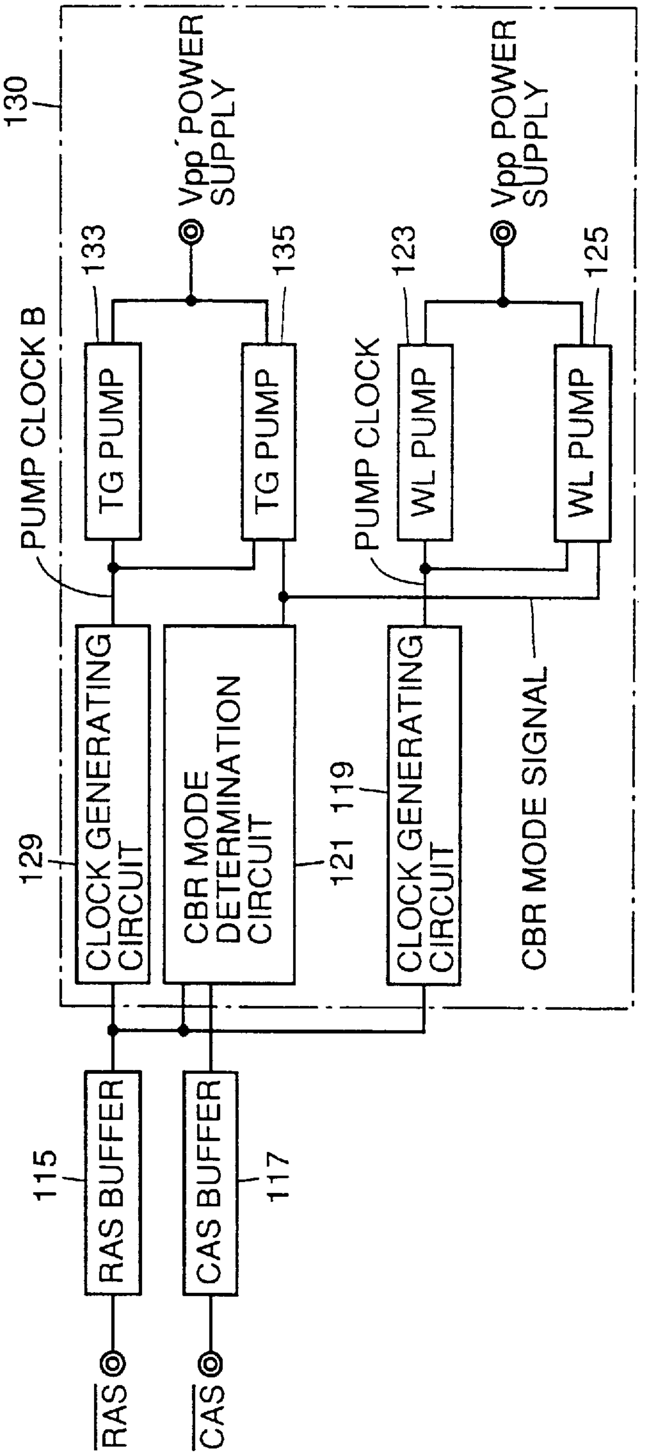
FIG. 11 is a block diagram showing a structure of an RAS buffer, a CAS buffer, and an internal voltage generating circuit of DRAM according to the third embodiment of the present invention.

FIG. 11 is a block diagram showing a structure of an RAS buffer 115, a CAS buffer 117 and an internal voltage generating circuit 130 in a DRAM 100 according to a third embodiment of the present invention.

Referring to FIG. 11, the structure of internal voltage generating circuit 130 is similar to that of the second embodiment shown in FIG. 6. However, it differs from the circuit in the second embodiment in that output nodes of WL pumps 123, 125 are in connection with one another and output nodes TG pumps 133, 135 are in connection with one another.

In FIG. 11, the charge generated by WL pumps 123, 125 is supplied to Vpp power supply while the charge generated by TG pumps 133, 135 is supplied to Vpp' power supply at a node which differs from that of Vpp power supply.

Accordingly, it is not necessary to provide a difference between the timings of pump clock A and pump clock B as in the second embodiment and thus there is no need for the structure such as a delay circuit for adjusting the timings of pump clocks A and B, making it possible to implement a simplified device.

(4) Fourth Embodiment

Figure 12:
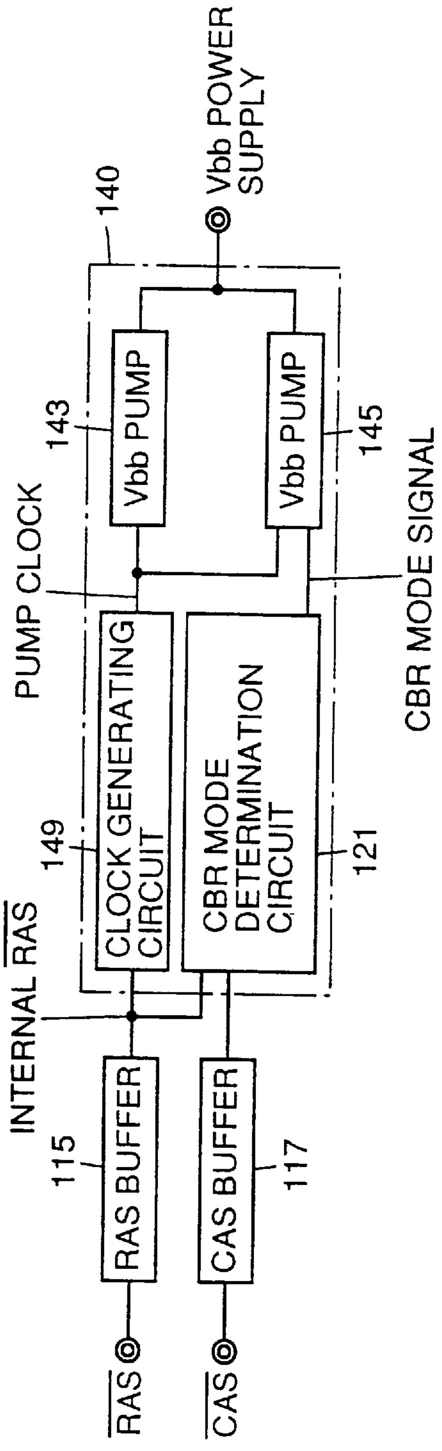
FIG. 12 is a block diagram showing a structure of an RAS buffer, a CAS buffer, and an internal voltage generating circuit of DRAM according to the fourth embodiment of the present invention.

FIG. 12 is a block diagram showing a structure of an RAS buffer 115 and a CAS buffer 117 and an internal voltage generating circuit 140 in a DRAM 100 according to a fourth embodiment of the present invention.

Referring to FIG. 12, internal voltage generating circuit 140 includes a CBR mode determination circuit 121, a clock generating circuit 149, and Vbb pumps 143, 145.

CBR mode determination circuit 121 is in connection with RAS buffer 115 and CAS buffer 117. Clock generating circuit 149 is in connection with RAS buffer 115. Vbb pump 143 is connected to clock generating circuit 149, and Vbb pump 145 is connected to clock generating circuit 149 as well as to CBR mode determination circuit 121.

In other words, when circuit 140 is compared with internal voltage generating circuit 130 according to the first embodiment shown in FIG. 2, clock generating circuit 149 instead of clock generating circuit 119 and Vbb pumps 143, 145 instead of WL pumps 123, 125 are connected.

In FIG. 12, in a manner similar to that of the first to third embodiments, CBR mode determination circuit 121 determines the timing of CBR mode from input timings of internal $\overline{RAS}$ and internal $\overline{CAS}$ produced at RAS buffer 115 and CAS buffer 117 based on external $\overline{RAS}$ and external $\overline{CAS}$ so as to generate a CBR mode signal which is output to Vbb pump 145. Internal $\overline{RAS}$ which is generated based on external $\overline{RAS}$ provides generation of pump clock C at clock generating circuit 149. Vbb pumps 143, 145 withdraw charge from Vbb power supply when it receives pump clock C. However, operation of Vbb pump 145 occurs only when CBR mode signal is activated (i.e., during CBR mode). Accordingly, sufficient charge can be withdrawn from Vbb power supply when CBR mode signal is activated (i.e., during CBR mode), to suppress variation in potential Vbb due to increase of substrate current when in CBR mode.

Figure 13:
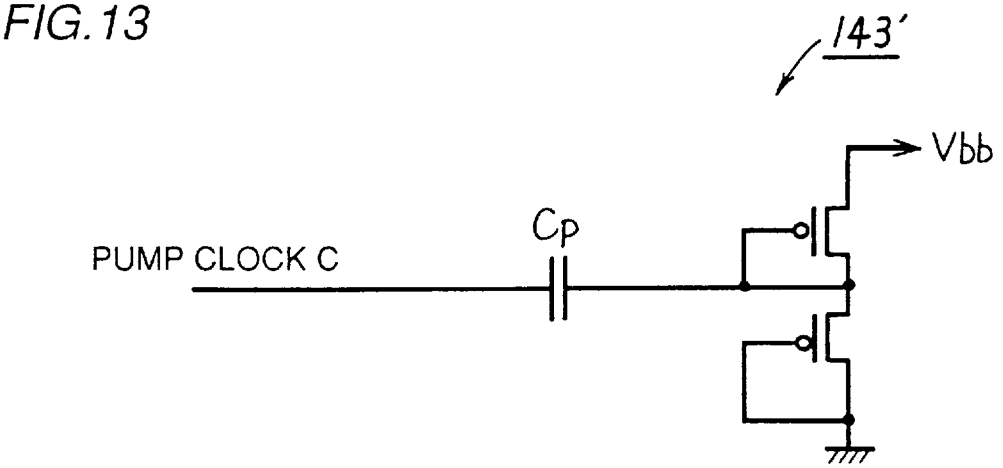
FIG. 13 is a circuit diagram showing a Vbb generating circuit as an example of Vbb pump of FIG. 12.

FIG. 13 shows a Vbb generating circuit 143' as an example of Vbb pump 143 in FIG. 12.

Figure 14:
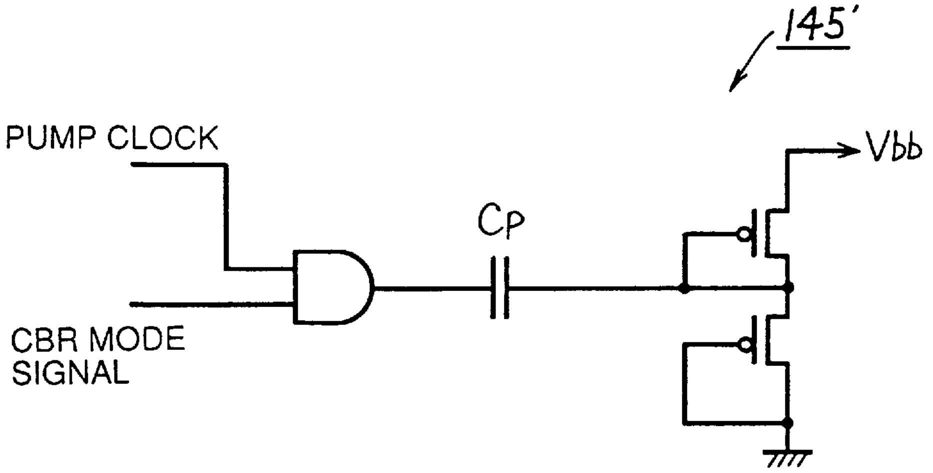
FIG. 14 is a circuit diagram showing a Vbb generating circuit as an example of Vbb pump of FIG. 12.

FIG. 14 shows a Vbb generating circuit 145' as an example of Vbb pump 145 in FIG. 12.

Referring to FIG. 14, a Vbb generating circuit 145' is a circuit identical to Vbb generating circuit 143' shown in FIG. 13, and performs an operation which is substantially similar to that of WL pump 125 in the first embodiment as well as TG pump 135 of the second and third embodiments to withdraw charge from Vbb power supply in synchronization with an AND output of pump clock C and CBR mode signal.

More specifically, it lowers the potential of Vbb power supply by charging a negative charge from GND when it receives pump clock C and supplying the negative charge to vbb power supply.

Thus, it is possible to prevent the potential of Vbb power supply from becoming shallower (i.e., higher) due to increase in the substrate current flowing into the substrate during CBR mode.

(5) Fifth Embodiment

Figure 19:
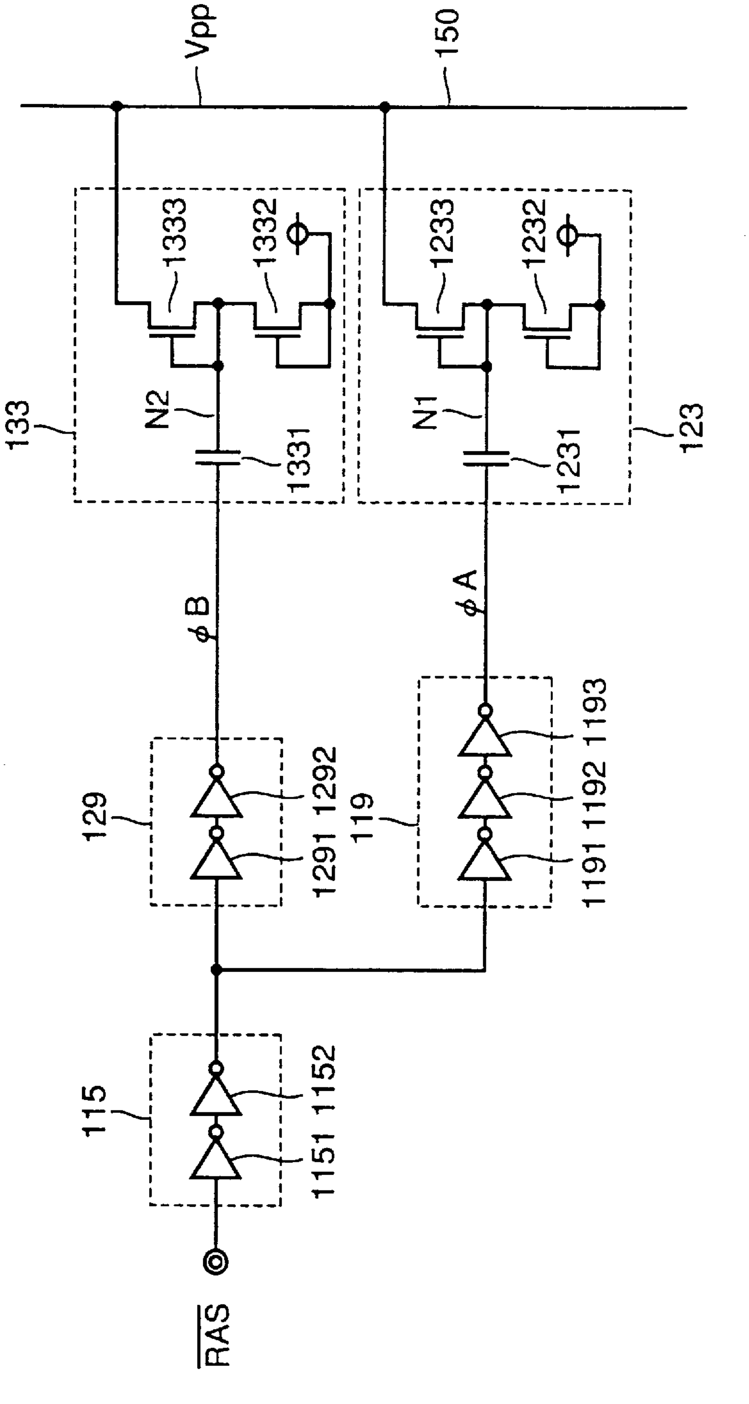
FIG. 19 is a circuit diagram showing a structure of an internal voltage generating circuit in relation with fifth to seventh embodiments according to the present invention.

Before providing description for the fifth embodiment, a description of an example for an internal voltage generating circuit will be set forth in order to facilitate understanding of this embodiment. Referring to FIG. 19, this internal voltage generating circuit includes a clock generating circuit 119 responsive to an internal $\overline{RAS}$ from an RAS buffer for generating a pump clock ϕA, a WL pump 123 responsive to pump clock ϕA for supplying a boost voltage Vpp to a boost power supply line 150, a clock generating circuit 129 responsive to internal $\overline{RAS}$ from RAS buffer for generating a pump clock ϕB, and a TG pump 133 responsive to pump clock ϕB for supplying boost voltage Vpp to boost power supply line 150.

RAS buffer 115 includes inverters 1151 and 1152. Clock generating circuit 119 includes inverters 1191 to 1193. Clock generating circuit 129 includes inverters 1291 and 1292. WL pump 123 includes a capacitor 1231 and N channel MOS transistors 1232, 1233. TG pump 133 includes a capacitor 1331 and N channel MOS transistors 1332, 1333.

RAS buffer 115 in FIG. 19 corresponds to RAS buffer 115 shown in FIG. 6. Clock generating circuit 119 of FIG. 19 corresponds to clock generating circuit 119 in FIG. 6. Clock generating circuit 129 in FIG. 19 corresponds to clock generating circuit 129 in FIG. 6. WL pump 123 shown in FIG. 19 corresponds to WL pump 123 in FIG. 6. TG pump 133 in FIG. 19 corresponds to TG pump 133 in FIG. 6.

When the DRAM operates in accordance with $\overline{RAS}$ having a period of 90 ns, the inactivation period $t_{RP}$ in which $\overline{RAS}$ is at H level is defined to be 30 ns, while the activation period $t_{RAS}$ in which $\overline{RAS}$ is at L level is defined to be 60 ns. In response to such $\overline{RAS}$, the internal voltage generating circuit in FIG. 19 operates as shown in the timing chart of FIG. 20.

Figure 20:
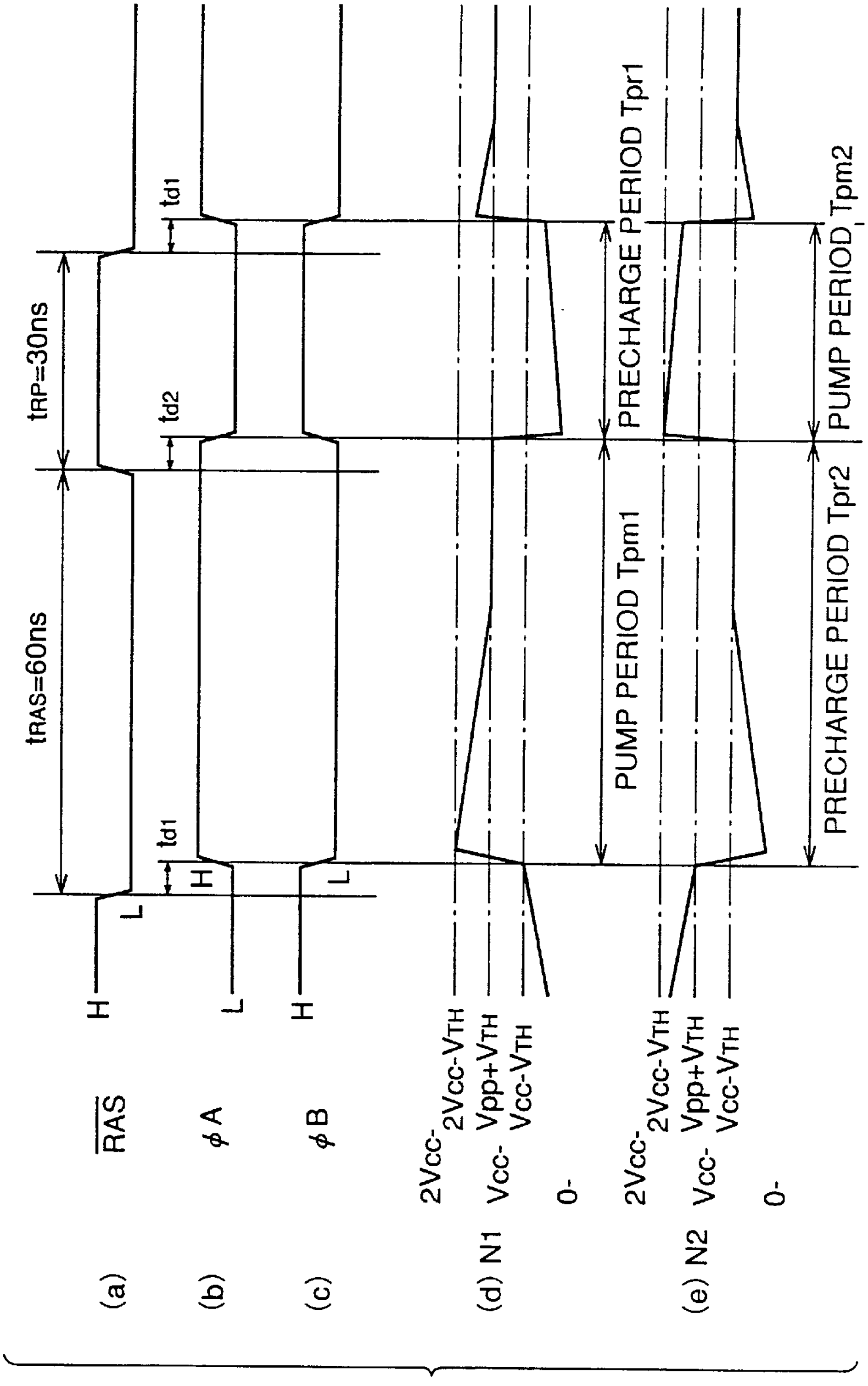
FIG. 20 is a timing chart illustrating the operation of the internal voltage generating circuit of FIG. 19.

As shown in FIG. 20(*b*), pump clock ϕA makes a transition from L level to H level when a prescribed delay period td1 has passed after the activation of $\overline{RAS}$. Pump clock ϕA makes a transition from H level to L level when a prescribed delay period td2 has expired after inactivation of $\overline{RAS}$.

In WL pump 123, a node N1 is precharged toward ($Vcc-V_{TH}$) level by transistor 1232 while pump clock ϕA is at H level. Here, $V_{TH}$ is the threshold voltage of transistor 1232. Meanwhile, as shown in FIG. 20(*e*), charge of a node N2 in TG pump 133 is supplied to a boost power supply line while pump clock ϕB is at H level, and the voltage of node N2 lowers toward ($Vpp+V_{TH}$). Here, $V_{TH}$ is the threshold voltage of transistor 1333.

However, since precharge period Tpr1 for precharging node N1 is short, node N1 is not precharged sufficiently to $(Vcc-V_{TH})$ level. Meanwhile, since the pump period Tpm2 for pumping out charge of node N2 is also short, node N2 cannot be pumped sufficiently to $(Vpp+V_{TH})$ level.

As a result, the precharge operation of WL pump 123 would be insufficient, and the pumping operation of TG pump 133 would also be insufficient. Accordingly, this internal voltage generating circuit cannot supply a sufficient boost voltage Vpp.

Therefore, the object of this fifth embodiment according to the present invention is to provide an internal voltage generating circuit which can supply a sufficient boost voltage Vpp.

Figure 21:
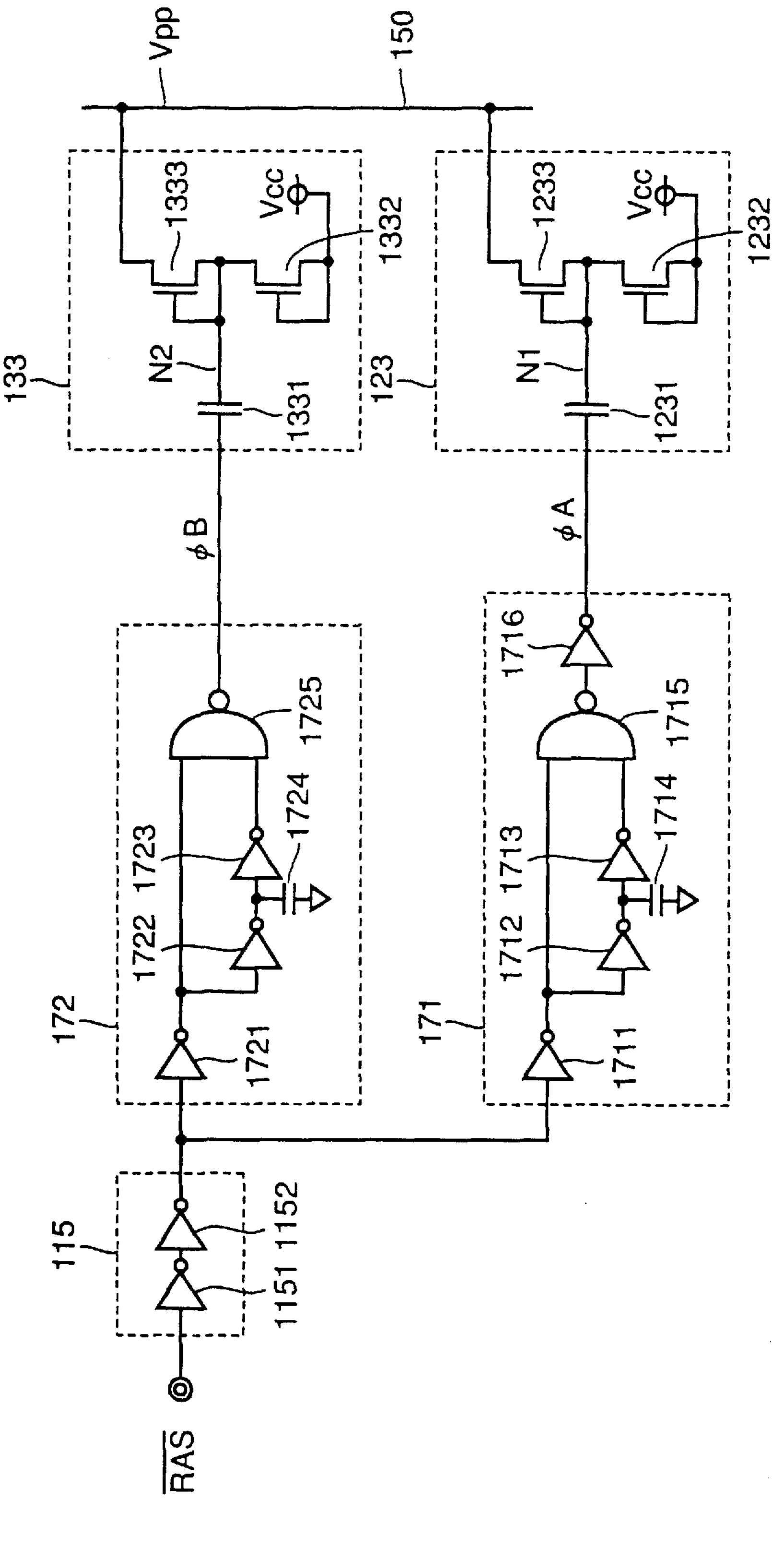
FIG. 21 is a circuit diagram showing a structure of an internal voltage generating circuit according to the fifth embodiment of the present invention.

Referring to FIG. 21, the internal voltage generating circuit according to the fifth embodiment of the present invention is responsive to a row address strobe signal $\overline{RAS}$ for controlling a semiconductor memory device such as DRAM to generate a boost voltage Vpp required for the semiconductor memory device. The internal voltage generating circuit includes a clock generating circuit 171 responsive to an internal $\overline{RAS}$ from an RAS buffer 115 for generating a pump clock ϕA, a WL pump 123 responsive to pump clock ϕA for supplying a boost voltage Vpp to a boost power supply line 150, a clock generating circuit 172 responsive to internal $\overline{RAS}$ from RAS buffer 115 for generating a pump clock ϕB, and a TG pump 133 responsive to pump clock ϕB for supplying boost voltage Vpp to boost power supply line 150. Unlike FIG. 19, clock generating circuit 171 of FIG. 21 includes inverters 1711 to 1713, a capacitor 1714, an NAND gate 1715 and an inverter 1716. Clock generating circuit 172 includes inverters 1721 to 1723, a capacitor 1724, and an NAND gate 1725.

Operation of the above-described internal voltage generating circuit will now be described in the following with reference to the timing chart of FIG. 22.

Figure 22:
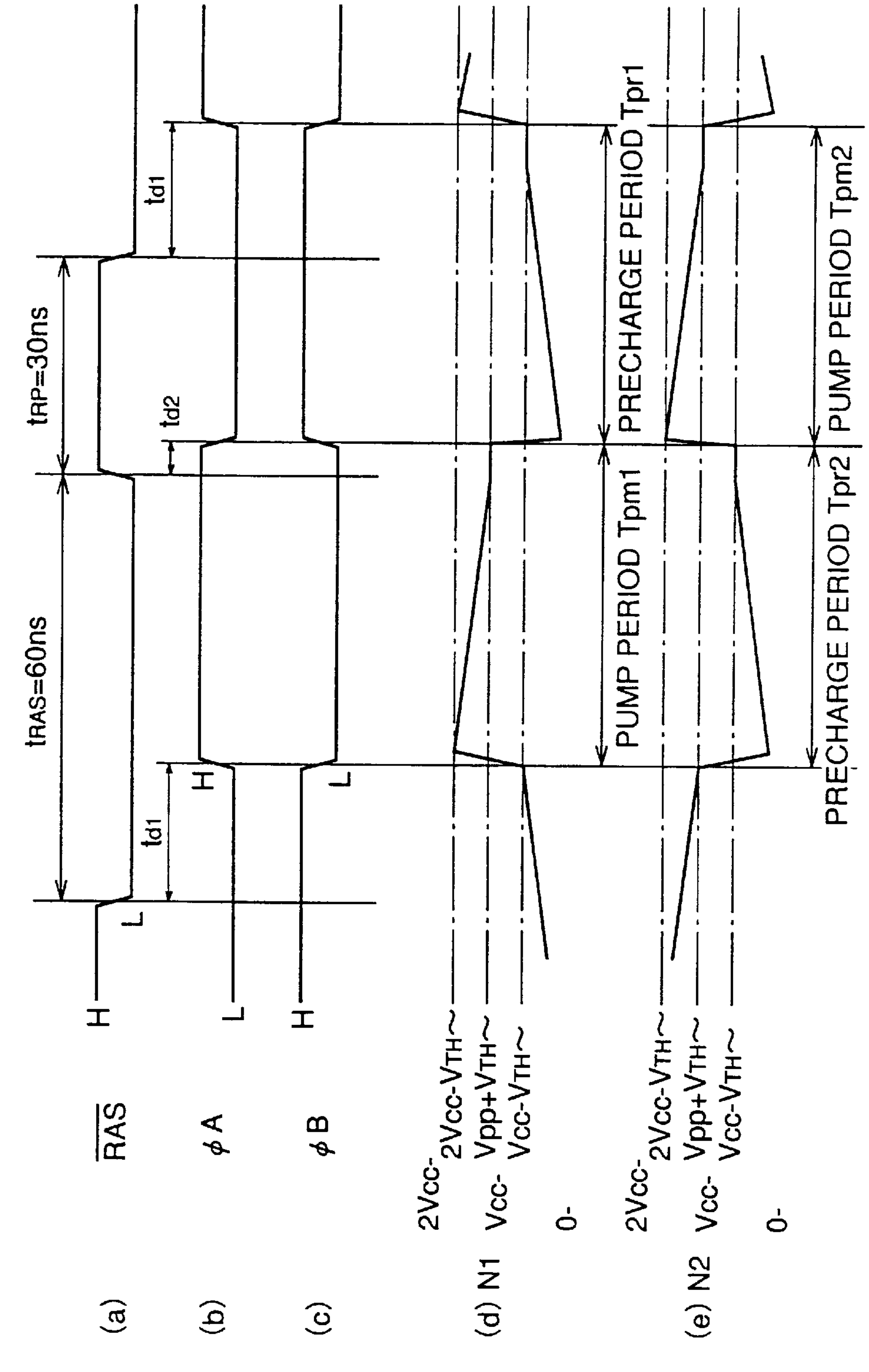
FIG. 22 is a timing chart illustrating the operation of the internal voltage generating circuit shown in FIG. 21.

As shown by (a) of FIG. 22, the output signals from inverters 1711 and 1721 make transition from L level to H level when $\overline{RAS}$ is activated. The output signal from inverter 1711 is immediately applied to one input node of NAND gate 1715. In addition, the output signal from inverter 1711 is delayed by inverters 1712, 1713 and capacitor 1714, and the delayed output signal is provided to the other input node of NAND gate 1715. Accordingly, the output signal of NAND gate 1715 makes a transition from H level to L level when a prescribed time period has passed after the activation of $\overline{RAS}$. Thus, pump clock ϕA makes a transition from L level to H level when a prescribed delay period td1 has expired after the activation of $\overline{RAS}$. Meanwhile, pump clock ϕB as well as pump clock ϕA makes a transition from H level to L level when a prescribed delay period td1 has passed after activation of $\overline{RAS}$ as shown by (c) of FIG. 22.

Before pump clock ϕA attains H level, node N1 in WL pump 123 is precharged at $(Vcc-V_{TH})$ level by transistor 1232 as shown by (d) of FIG. 22. When pump clock ϕA makes a transition to H level, the voltage of node N1 is raised by Vcc owing to a coupling effect of capacitor 1231. Accordingly, as shown by (d) of FIG. 22, the voltage of node N1 attains $(2Vcc-V_{TH})$ level. When voltage is made higher than $(Vpp+V_{TH})$ level as described above, transistors 1233 is turned on and charge of node N1 is supplied to boost power supply line 150 through transistor 1233. Accordingly, the voltage of node N1 is gradually lowered to $(Vpp+V_{TH})$ level. This is because transistor 1233 would be turned off when the voltage of node N1 reaches $(Vpp+V_{TH})$ level.

Meanwhile, before transition of pump clock ϕB to L level, the voltage of node N2 is at $(Vpp+V_{TH})$ level as shown by (e) of FIG. 22. This is because transistor 1333 is turned off when the voltage of node N2 attains $(Vpp+V_{TH})$ level. When pump clock ϕB makes a transition to L level as shown by (c) of FIG. 22, the voltage of node N2 is lowered by Vcc from $(Vpp+V_{TH})$ level owing to the coupling effect of capacitor 1331. When the voltage of node N2 is made lower than $(Vcc-V_{TH})$ level, transistor 1332 is turned on and charge is supplied to node N2 through transistor 1332 from power supply (Vcc) node. Accordingly, the voltage of node N2 is gradually made higher up to $(Vcc-V_{TH})$ as shown by (e) of FIG. 22. This is because transistor 1332 is turned off when the voltage of node N2 attains $(Vcc-V_{TH})$ level.

Thereafter, when $\overline{RAS}$ is inactivated as shown in FIG. 22(*a*), the output signal of inverter 1711 attains L level. This output signal at L level is immediately applied to one input node of NAND gate 1715 such that the output signal from NAND gate 1715 immediately attains H level. Accordingly, as shown by (b) of FIG. 22, pump clock ϕA makes a transition from H level to L level when a prescribed delay period td2 has passed after inactivation of $\overline{RAS}$. Meanwhile, as shown by (c) of FIG. 22, pump clock ϕB also makes a transition from L level to H level upon expiration of a prescribed delay period td2 from inactivation of $\overline{RAS}$, in a similar manner to that of pump clock ϕA.

When there is a transition of pump clock ϕA from H level to L level, the voltage of node N1 is lowered by Vcc from $(Vpp+V_{TH})$ level as shown by (d) of FIG. 22 owing to the coupling action of capacitor 1231. When the voltage of node N1 is made lower than $(Vcc-V_{TH})$ level, transistor 1232 is turned on so that charge is supplied to node N1 through transistor 1232 from power supply (Vcc) node. Accordingly, node N1 is precharged to $(Vcc-V_{TH})$ level.

Meanwhile, when there is a transition of pump clock ϕB from L level to H level, the voltage of node N2 is made higher by Vcc from $(Vcc-V_{TH})$ level as shown by (e) of FIG. 22 owing to the coupling action of capacitor 1331. When the voltage of node N2 is made higher than $(Vpp+V_{TH})$ level, transistor 1333 is turned on and charge of node N2 is supplied to boost power supply line 150 through transistor 1333. Therefore, the voltage of node N2 is lowered to $(Vpp+V_{TH})$ level.

Subsequently, $\overline{RAS}$ is activated again when 30 ns (inactivation period $t_{RP}$) has passed after inactivation of RAS, as shown by (a) of FIG. 22. As has been described above, pump clock ϕA does not make a transition immediately after activation of $\overline{RAS}$ but is changed from L level to H level when a prescribed delay period td1 has expired after activation of $\overline{RAS}$. Pump clock ϕB also does not make a transition immediately after activation of $\overline{RAS}$, but is changed from H level to L level when a prescribed delay period td1 has passed after activation of $\overline{RAS}$.

Briefly speaking, clock generating circuits 171 and 172 are formed in this fifth embodiment such that delay period td1 would be longer than delay period td2. Accordingly, the duty ratios of pump clocks ϕA and ϕB are both nearly 1:1.

As a result, since precharge period Tpr1 of WL pump 123 in the fifth embodiment is longer than the precharge period Tpr1 in FIG. 20, node N1 can be fully precharged to $(Vcc-V_{TH})$ level during this longer precharge period Tpr1. In addition, since pump period Tpm2 of TG pump 133 in this fifth embodiment is longer than pump period Tpm2 in FIG. 20, the charge of node N2 is fully supplied to boost power supply line 150 during this longer pump period Tpm2 such that the voltage of node N2 can be lowered to $(Vpp+V_{TH})$ level.

Thus, according to the fifth embodiment, delay period td1 is longer than delay period td2 so that node N1 in WL pump 123 is fully precharged during precharge period Tpr1. As a result, WL pump 123 can supply boost voltage Vpp more sufficiently as compared to WL pump 123 in FIG. 19. Meanwhile, the charge of node N2 in TG pump 133 is fully supplied to boost power supply line 150 during pump period Tpm2. As a result, TG pump 133 can supply boost voltage Vpp more sufficiently as compared to TG pump 133 in FIG. 19.

(6) Sixth Embodiment

Figure 23:
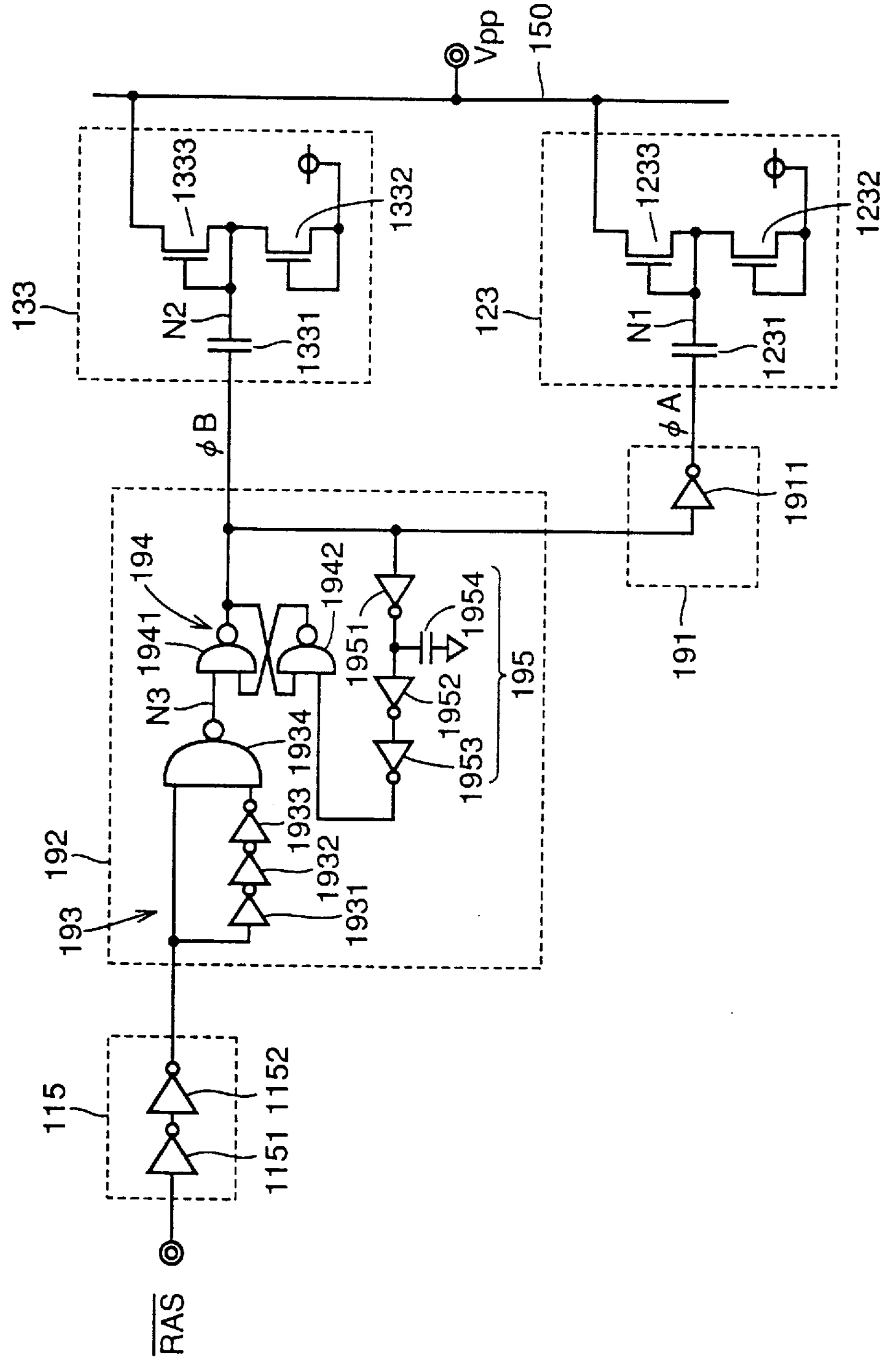
FIG. 23 is a circuit diagram showing a structure of an internal voltage generating circuit according to the sixth embodiment of the present invention.

Referring to FIG. 23, an internal voltage generating circuit according to the sixth embodiment of the present invention includes a clock generating circuit 192 responsive to an internal $\overline{RAS}$ from an RAS buffer 115 for generating a pump clock ϕB, a TG pump 133 responsive to pump clock ϕB for supplying a boost voltage Vpp to a boost power supply line 150, a clock generating circuit 191 responsive to pump clock ϕB for generating pump clock ϕA, and a WL pump 123 responsive to pump clock ϕA for supplying boost voltage Vpp to boost power supply line 150. FIG. 23 differs from FIG. 19 in that clock generating circuit 192 includes a one-shot circuit 193, a flipflop circuit 194 and a delay circuit 195. One-shot circuit 193 includes inverters 1931 to 1933 and an NAND gate 1934. Flipflop circuit 194 includes NAND gates 1941 and 1942. Delay circuit 195 includes inverters 1951 to 1953 and a capacitor 1954. Meanwhile, clock generating circuit 191 includes an inverter 1911 and is responsive to pump clock ϕB from clock generating circuit 192.

Operation of the above-described internal voltage generating circuit will now be described in the following with reference to the timing chart of FIG. 24.

Figure 24:
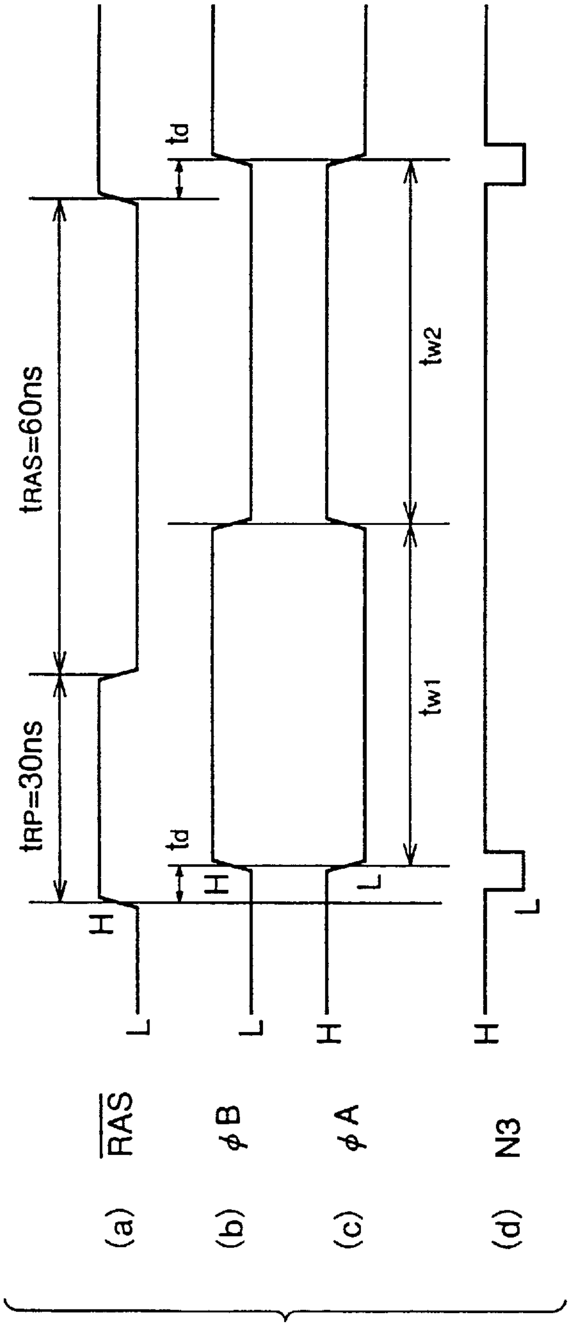
FIG. 24 is a timing chart illustrating the operation of the internal voltage generating circuit shown in FIG. 23.

When $\overline{RAS}$ makes a transition from L level to H level as shown in (a) of FIG. 24, one-shot pulse circuit 193 generates a one-shot pulse. Accordingly, the voltage of node N3 in clock generating circuit 192 will be at L level for a prescribed time period as shown in (d) of FIG. 24. When the voltage of node N3 attains L level, flipflop circuit 194 is set and pump clock ϕB makes a transition from L level to H level as shown in (b) of FIG. 24. Pump clock ϕB at H level is provided to flipflop circuit 194 after a delay by delay circuit 195. Accordingly, flipflop circuit 194 is reset when a prescribed delay period tw1 has expired after it was set. Delay circuit 195 is formed such that delay period tw1 would be longer than inactivation period $t_{RP}$ (30 ns) of $\overline{RAS}$. When flipflop circuit 194 is reset, pump clock ϕB makes a transition from H level to L level as shown by (b) of FIG. 24. Meanwhile, since pump clock ϕA is generated in response to pump clock ϕB by inverter 1911, pump clock ϕA would be at L level during the time in which pump clock ϕB is at H level and would be at H level during the time in which pump clock ϕB is at L level, as shown by (c) of FIG. 24.

As has been described above, since delay period tw1 of delay circuit 195 is set to be longer than inactivation period $t_{RP}$ of $\overline{RAS}$, the duty ratios of pump clocks ϕB and ϕA are both nearly 1:1. As a result, node N1 in WL pump 123 is fully precharged during the precharge period (tw1) as in the above-described fifth embodiment. Meanwhile, the charge of node N2 in TG pump 133 is fully supplied to boost power supply line 150 during the pump period (tw1).

Thus, according to this sixth embodiment, since pump clock ϕB makes a transition to L level when delay period tw1 has expired after its transition to H level and delay period tw1 is longer than inactivation period $t_{RP}$ of $\overline{RAS}$, TG pump 133 can supply boost voltage Vpp more sufficiently as compared to TG pump 133 in FIG. 19. In addition, since pump clock ϕA makes a transition to H level after delay period tw1 has expired after its transition to L level and since delay period tw1 is longer than inactivation period tp of $\overline{RAS}$, WL pump 123 can supply boost voltage Vpp more sufficiently as compared to WL pump 123 in FIG. 19.

(7) Seventh Embodiment

Figure 25:
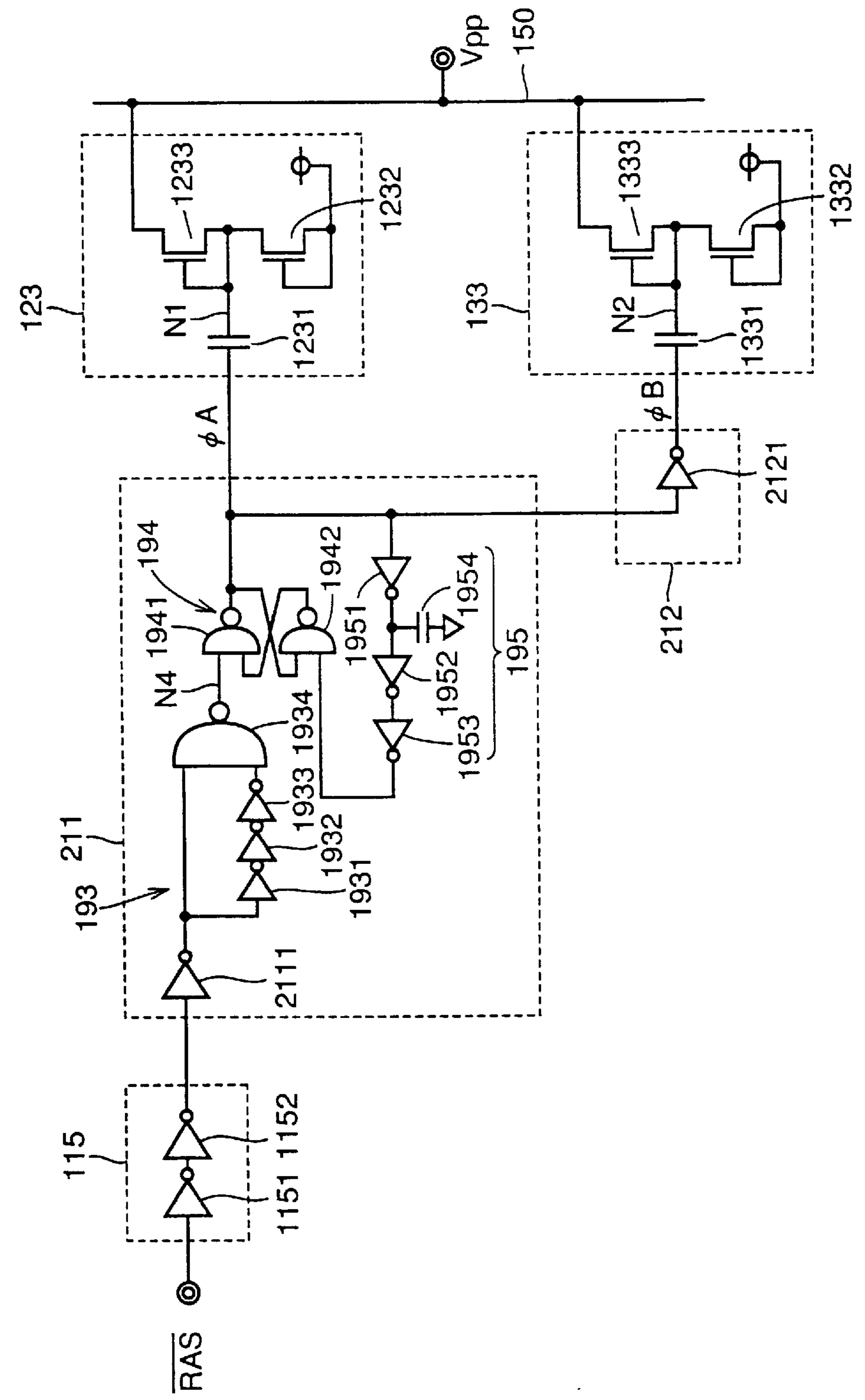
FIG. 25 is a circuit diagram showing a structure of an internal voltage generating circuit according to a seventh embodiment of the present invention.

Referring to FIG. 25, an internal voltage generating circuit according to the seventh embodiment of the present invention includes a clock generating circuit 211 responsive to an internal $\overline{RAS}$ from an RAS buffer 115 for generating a pump clock ϕA, a WL pump 123 responsive to pump clock ϕA for supplying a boost voltage Vpp to a boost power supply line 150, a clock generating circuit 212 responsive to pump clock ϕA for generating a pump clock ϕB, and a TG pump 133 responsive to pump clock ϕB for supplying boost voltage Vpp to boost power supply line 150. Clock generating circuit 211 includes an inverter 2111 in addition to the structure of clock generating circuit 192 shown in FIG. 23. Clock generating circuit 212 includes an inverter 2121.

Operation of the above-described internal voltage generating circuit will now be described in the following with reference to the timing chart of FIG. 26.

Figure 26:
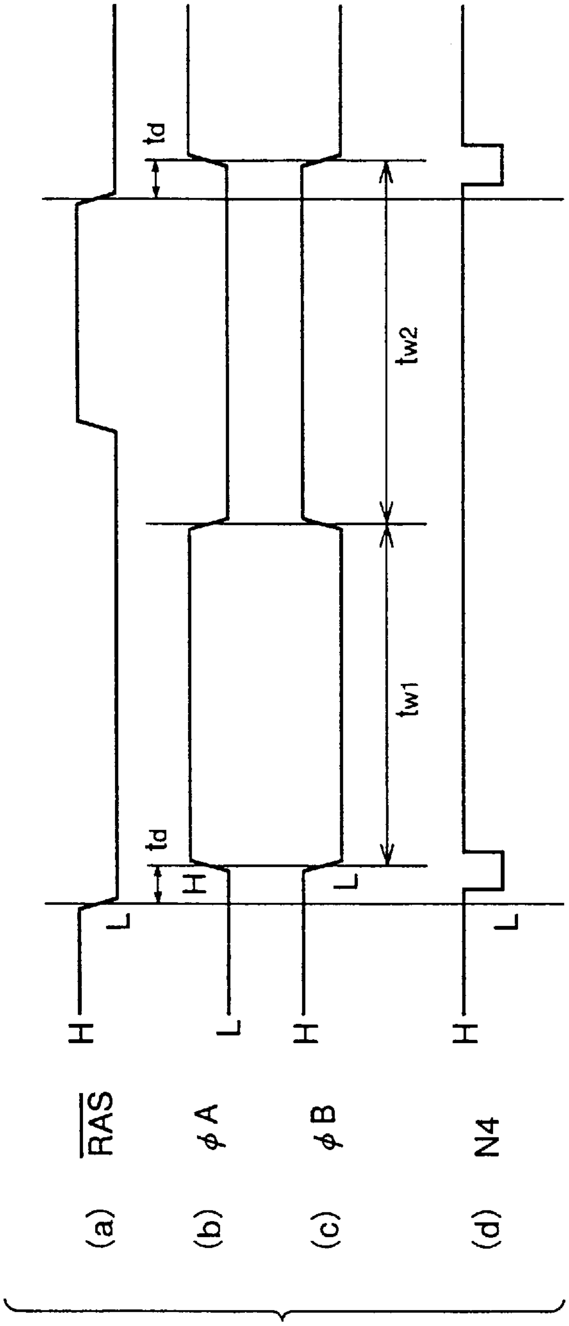
FIG. 26 is a timing chart illustrating the operation of the internal voltage generating circuit shown in FIG. 25.

When $\overline{RAS}$ is activated as shown by (a) of FIG. 26, the voltage of node N4 in clock generating circuit 211 would be at L level for a prescribed time period as shown by (d) of FIG. 26. This sets flipflop circuit 194 so that pump clock ϕA makes a transition from L level to H level as shown in (b) of FIG. 26 while pump clock ϕB makes a transition from H level to L level as shown in (c) of FIG. 26. Since flipflop 194 is reset when a prescribed delay period tw1 has expired after transition of pump clock ϕA to H level, pump clock ϕA makes a transition from H level to L level while pump clock ϕB makes a transition from L level to H level. Since delay period tw1 is set to be longer than activation period $t_{RP}$ of $\overline{RAS}$, the duty ratios of pump clocks ϕA and αB would both be nearly 1:1 as in the above-described sixth embodiment.

Thus, according to the seventh embodiment, since pump clock ϕA makes a transition to L level when delay period tw1 has expired after its transition to H level and since delay period tw1 is longer than inactivation period $t_{RP}$ of $\overline{RAS}$, WL pump 123 can supply boost voltage Vpp sufficiently. In addition, since pump clock ϕB makes a transition to H level when delay period tw1 has passed after its transition to L level, and since delay period tw1 is longer than inactivation period $t_{RP}$ of $\overline{RAS}$, TG pump 133 can supply boost voltage Vpp sufficiently.

In addition, although the above-described fifth to seventh embodiments are related to circuits for generating boost voltage Vpp, the present invention can also be applied to circuits for generating substrate voltage Vbb. In an internal voltage generating circuit for generating a substrate voltage to which the present invention is applied, a Vbb pump as shown in FIG. 13 is employed instead of WL pump 123 or TG pump 133.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal voltage generating circuit responsive to an address strobe signal for controlling a semiconductor memory device for generating an internal voltage required for said semiconductor memory device, comprising:

clock signal generating means for generating a clock signal transiting to a first logic level upon expiration of a first delay period after activation of said address strobe signal and transiting to a second logic level upon expiration of a second delay period after inactivation of said address strobe signal, said first delay period being longer than said second delay period; and a charge pump circuit coupled to said clock signal generating means for generating said internal voltage in response to said clock signal.

2. An internal voltage generating circuit responsive to an address strobe signal for controlling a semiconductor memory device for generating an internal voltage required for said semiconductor memory device, said address strobe signal having a prescribed inactivation period, said internal voltage generating circuit comprising:

clock signal generating means for generating a clock signal transiting to a first logic level in response to activation/inactivation of said address strobe signal and transiting to a second logic level upon expiration of a prescribed delay period after its transition to said first logic level, said delay period being longer than said inactivation period; and a charge pump circuit coupled to said clock signal generating means for generating said internal voltage in response to said clock signal.

3. The internal voltage generating circuit according to claim 1, wherein said clock signal generating means includes delaying means for delaying said address strobe signal, and an NAND circuit receiving said address strobe signal to be delayed and said address strobe signal delayed by said delaying means to provide said clock signal.

4. The internal voltage generating circuit according to claim 3, wherein said delaying means includes a first inverter receiving said address strobe signal, a capacitor coupled to an output of said first inverter, and a second inverter receiving an output signal from said first inverter to provide said delayed address strobe signal.

5. The internal voltage generating circuit according to claim 2, wherein said clock signal generating means includes a one-shot circuit receiving said address strobe signal, a flipflop circuit, and delaying means for delaying an output signal from said flipflop circuit, and said flipflop circuit being set in response to an output signal from said one-shot circuit and being reset in response to the output signal delayed by said delaying means.

6. The internal voltage generating circuit according to claim 5, wherein said delaying means includes a first inverter receiving the output signal from said flipflop circuit, a capacitor coupled to an output of said first inverter, and a second inverter receiving an output signal from said first inverter to provide said delayed output signal.

* * * * *